(12) United States Patent
Kim et al.

(10) Patent No.: US 10,910,387 B2
(45) Date of Patent: Feb. 2, 2021

(54) SEMICONDUCTOR DEVICES

(71) Applicant: Samsung Electronics Co., Ltd., Suwon-si (KR)

(72) Inventors: Sangyoung Kim, Yangpyeong-gun (KR); Hyung Jong Lee, Osan-si (KR); Deokhan Bae, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 14 days.

(21) Appl. No.: 16/374,363

(22) Filed: Apr. 3, 2019

(65) Prior Publication Data

US 2019/0229121 A1 Jul. 25, 2019

Related U.S. Application Data

(63) Continuation of application No. 15/842,056, filed on Dec. 14, 2017, now abandoned.

(30) Foreign Application Priority Data

Apr. 27, 2017 (KR) ........................ 10-2017-0054567

(51) Int. Cl.
*H01L 23/522* (2006.01)
*H01L 23/528* (2006.01)
(Continued)

(52) U.S. Cl.
CPC .. *H01L 27/1104* (2013.01); *H01L 21/823431* (2013.01); *H01L 23/5226* (2013.01);
(Continued)

(58) Field of Classification Search
CPC ............. H01L 27/1104; H01L 27/1116; H01L 27/0207; H01L 27/0886; H01L 27/092; H01L 27/1211; H01L 23/5226; H01L 23/522; H01L 23/528; H01L 23/5486; H01L 23/49838; H01L 23/5283;
(Continued)

(56) References Cited

U.S. PATENT DOCUMENTS 7,598,570 B2  10/2009  Hirano
8,183,114 B2   5/2012  Tsuboi
(Continued)

FOREIGN PATENT DOCUMENTS

KR    1020080082426    9/2008

*Primary Examiner* — Natalia A Gondarenko
(74) *Attorney, Agent, or Firm* — Myers Bigel, P.A.

(57) ABSTRACT

Disclosed is a semiconductor device including a first active pattern and a second active pattern that extend in a first direction on a substrate and are spaced apart from each other in a second direction crossing the first direction, a first gate structure that extends across the first and second active patterns, a second gate structure that is spaced apart from the first gate structure, and a node contact between the first and second gate structures that electrically connects the first active pattern and the second active pattern to each other. The node contact comprises a first end adjacent to the first active pattern and a second end adjacent to the second active pattern. The second end of the node contact being shifted in the first direction relative to the first end of the node contact so as to be closer to the second gate structure than to the first gate structure.

19 Claims, 29 Drawing Sheets

(51) Int. Cl.
*H01L 27/11* (2006.01)
*H01L 27/088* (2006.01)
*H01L 21/8234* (2006.01)
*H01L 29/78* (2006.01)

(52) U.S. Cl.
CPC ...... *H01L 23/5283* (2013.01); *H01L 27/0886* (2013.01); *H01L 29/785* (2013.01)

(58) Field of Classification Search
CPC ............... H01L 23/5286; H01L 29/785; H01L 29/42356; H01L 2224/48227; H01L 2224/73265; H01L 23/535; H01L 23/538; H01L 23/5386; H01L 23/53257; H01L 23/585; H01L 24/30; H01L 24/33; H01L 24/82; H01L 21/845; H01L 21/823431; H01L 21/823475; H01L 29/41791; H01L 29/41783; H01L 29/401; H01L 29/66795; H01L 21/02164; H01L 21/0217; H01L 21/31105; H01L 21/28247; G06F 17/5077; G06F 2217/06
USPC ................................ 257/393, 401, 750, 758
See application file for complete search history.

(56) References Cited

U.S. PATENT DOCUMENTS

| | | |
|---|---|---|
| 8,274,099 B2 | 9/2012 | Becker |
| 9,530,780 B2 | 12/2016 | Kim |
| 2005/0275043 A1 | 12/2005 | Huang |
| 2008/0157221 A1 | 7/2008 | Lee |
| 2013/0207199 A1* | 8/2013 | Becker ............... H01L 27/0886 257/369 |
| 2015/0371701 A1 | 12/2015 | Liaw |
| 2016/0181235 A1 | 6/2016 | Pincu |
| 2017/0133391 A1 | 5/2017 | Taniguchi |
| 2017/0154966 A1 | 6/2017 | Huang |

\* cited by examiner

SEMICONDUCTOR DEVICES

CROSS-REFERENCE TO RELATED APPLICATIONS

This application is a continuation of U.S. patent application Ser. No. 15/842,056, filed Dec. 14, 2017, which itself claims the benefit of priority under 35 U.S.C. § 119 of Korean Patent Application No. 10-2017-0054567 filed on Apr. 27, 2017 the entire contents of which are hereby incorporated by reference.

BACKGROUND

The present inventive concept relates to semiconductor devices, and, more particularly, to semiconductor devices including an SRAM cell.

Semiconductor devices are widely used in the electronic industry due to their compact size, multifunction, and/or low manufacturing cost. The semiconductor devices may include, on at least portions thereof, memory cells that store logic data.

The memory cells may include nonvolatile memory cells and volatile memory cells. A nonvolatile memory cell is characterized by the ability to retain its stored data even when its power supply is interrupted. For example, a flash memory cell, a phase change memory cell, and a magnetic memory cell are all examples of nonvolatile memory cells. A volatile memory cell is characterized by losing its stored data when its power supply is interrupted. For example, a static random access memory (SRAM) cell and a dynamic random access memory (DRAM) cell are all examples of volatile memory cells. An SRAM cell typically has low power consumption and high operating speed in comparison with a DRAM cell.

An SRAM cell may be configured with a node contact between adjacent gate structures. Typically, the node contact is spaced apart from the adjacent gate structures at approximately the same distance. The node contact is generally only designed to be electrically connected to one of the two adjacent gate structures. In highly integrated memory devices, however, the margins between the node contact and the adjacent gate structures may be small, which may increase the risk of electrical shorts between the node contact and an adjacent gate structure.

SUMMARY

Embodiments of the present inventive concept provide a semiconductor device optimized for high integration.

Embodiments of the present inventive concept provide a semiconductor device having improved electrical characteristics.

According to exemplary embodiments of the present inventive concept, a semiconductor device may comprise: a first active pattern and a second active pattern that extend in a first direction on a substrate and are spaced apart from each other in a second direction crossing the first direction; a first gate structure that extends across the first and second active patterns; a second gate structure that is spaced apart from the first gate structure; and a node contact between the first gate structure and the second gate structure that electrically connects the first active pattern and the second active pattern to each other. The node contact may comprise a first end adjacent to the first active pattern and a second end adjacent to the second active pattern. The second end of the node contact may be shifted in the first direction relative to the first end of the node contact so as to be closer to the second gate structure than to the first gate structure.

According to exemplary embodiments of the present inventive concept, a semiconductor device may comprise: a first active pattern and a second active pattern that extend in a first direction on a substrate and are spaced apart from each other in a second direction crossing the first direction; a first gate structure that extends across the first and second active patterns; and a node contact on a side of the first gate structure and electrically connects the first and second active patterns to each other. The node contact may comprise a first end adjacent to the first active pattern and a second end adjacent to the second active pattern. The first end of the node contact may be spaced apart from the first gate structure at a first distance. The second end of the node contact may be spaced apart from the first gate structure at a second distance greater than the first distance.

According to exemplary embodiments of the present inventive concept, a semiconductor device may comprise: a first gate structure on a substrate; a second gate structure spaced apart in a first direction from the first gate structure; a third gate structure spaced apart in the first direction from the first gate structure; and a node contact between the first gate structure and the second gate structure and between the first gate structure and the third gate structure. The second and third gate structures may be aligned with each other in a second direction crossing the first direction. The node contact may comprise a first end between the first and third gate structures and a second end between the first and second gate structures. The second end of the node contact may be shifted in the first direction relative to the first end of the node contact so as to be closer to the second gate structure than to the first gate structure.

It is noted that aspects of the inventive concepts described with respect to one embodiment, may be incorporated in a different embodiment although not specifically described relative thereto. That is, all embodiments and/or features of any embodiment can be combined in any way and/or combination. These and other aspects of the inventive concepts are described in detail in the specification set forth below.

BRIEF DESCRIPTION OF THE DRAWINGS

FIGS. 5A to 9A are cross-sectional views corresponding to line I-I' of FIG. 2 illustrating a method of fabricating a semiconductor device according to exemplary embodiments of the present inventive concept.

FIGS. 5B to 9B are cross-sectional views corresponding to line II-II' of FIG. 2 illustrating a method of fabricating a semiconductor device according to exemplary embodiments of the present inventive concept.

FIGS. 5C to 9C are cross-sectional views corresponding to line III-III' of FIG. 2 illustrating a method of fabricating a semiconductor device according to exemplary embodiments of the present inventive concept.

FIGS. 5D to 9D are cross-sectional views corresponding to line IV-IV' of FIG. 2 illustrating a method of fabricating a semiconductor device according to exemplary embodiments of the present inventive concept.

DETAILED DESCRIPTION OF EMBODIMENTS

Hereinafter, embodiments of the present inventive concept will be described in detail in conjunction with the accompanying drawings.

Some embodiments of the inventive concept stem from the realization that a semiconductor device, such as an SRAM cell, may be configured with a node contact between two adjacent gate structures. The node contact may be electrically connected to one of the two adjacent gate structures in such a manner that the end of the node contact that is electrically connected to one of the two gate structures is shifted in a direction towards the gate structure to which it is connected relative to the other end of the node contact. By decreasing the distance between the node contact and the gate structure to which it is electrically connected and increasing the distance between the node contact and the gate structure to which it is not electrically connected, the likelihood of a short between the two gate structures may be reduced.

Figure 1:
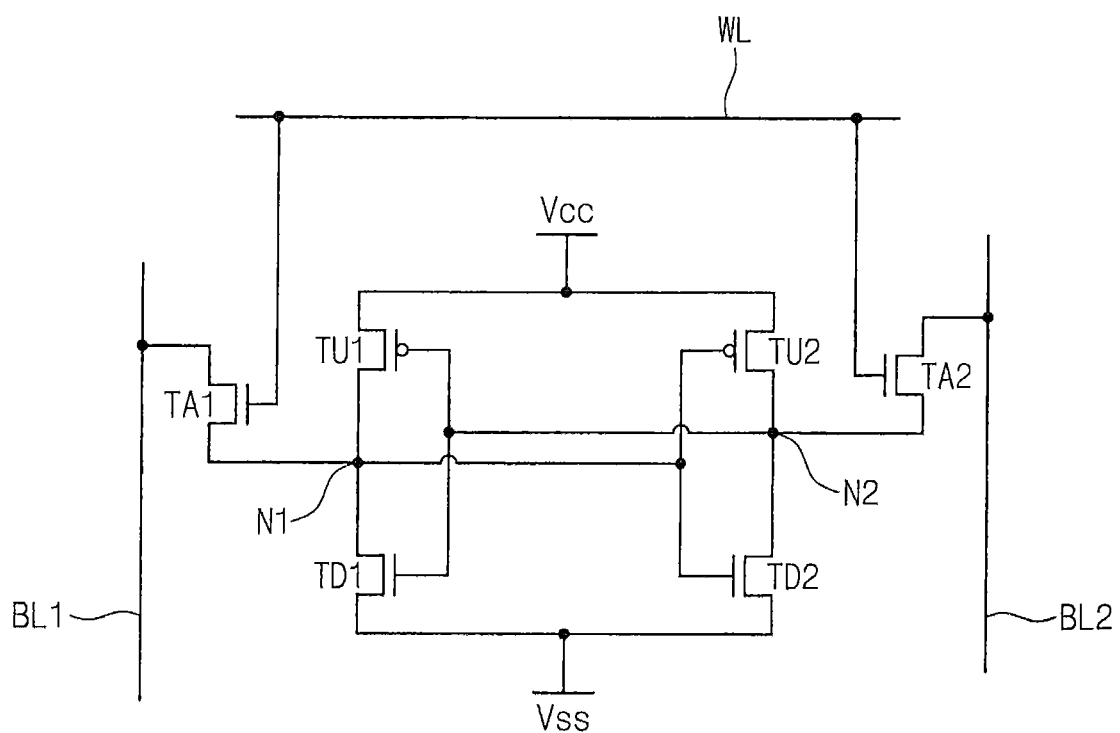
FIG. 1 is an equivalent circuit diagram illustrating a unit memory cell of a semiconductor device according to exemplary embodiments of the present inventive concept.

FIG. 1 is an equivalent circuit diagram showing a unit memory cell of a semiconductor device according to exemplary embodiments of the present inventive concept.

Referring to FIG. 1, a semiconductor device may include an SRAM cell. The SRAM cell may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be PMOS transistors. The first and second pull-down transistors TD1 and TD2 and the first and second access transistors TA1 and TA2 may be NMOS transistors.

The first pull-up and pull-down transistors TU1 and TD1 may each have a first source/drain connected to a first node N1. The first pull-up transistor TU1 may have a second source/drain connected to a power line Vcc, and the first pull-down transistor TD1 may have a second source/drain connected to a ground line Vss. The first pull-up and pull-down transistors TU1 and TD1 may have their gates electrically connected to each other. The first pull-up and pull-down transistors TU1 and TD1 may constitute a first inverter. The first inverter may have an input terminal corresponding to the connected gates of the first pull-up and pull-down transistors TU1 and TD1 and an output terminal corresponding to the first node N1.

The second pull-up and pull-down transistors TU2 and TD2 may each have a first source/drain connected to a second node N2. The second pull-up transistor TU2 may have a second source/drain connected to the power line Vcc, and the second pull-down transistor TD2 may have a second source/drain connected to the ground line Vss. The second pull-up and pull-down transistors TU2 and TD2 may have their gates electrically connected to each other. The second pull-up and pull-down transistors TU2 and TD2 may constitute a second inverter. The second inverter may have an input terminal corresponding to the connected gates of the second pull-up and pull-down transistors TU2 and TD2 and an output terminal corresponding to the second node N2.

The first and second inverters may be mutually connected to constitute a latch structure. In this configuration, the gates of the first pull-up and pull-down transistors TU1 and TD1 may be electrically connected to the second node N2, and the gates of the second pull-up and pull-down transistors TU2 and TD2 may be electrically connected to the first node N1. The first access transistor TA1 may have a first source/drain connected to the first node N1 and a second source/drain connected to a first bit line BL1. The second access transistor TA2 may have a second source/drain connected to the second node N2 and a second source/drain connected to a second bit line BL2. The first and second access transistors TA1 and TA2 may have their gates electrically connected to a word line WL. The circuit of FIG. 1 may, therefore, provide an SRAM cell.

Figure 2:
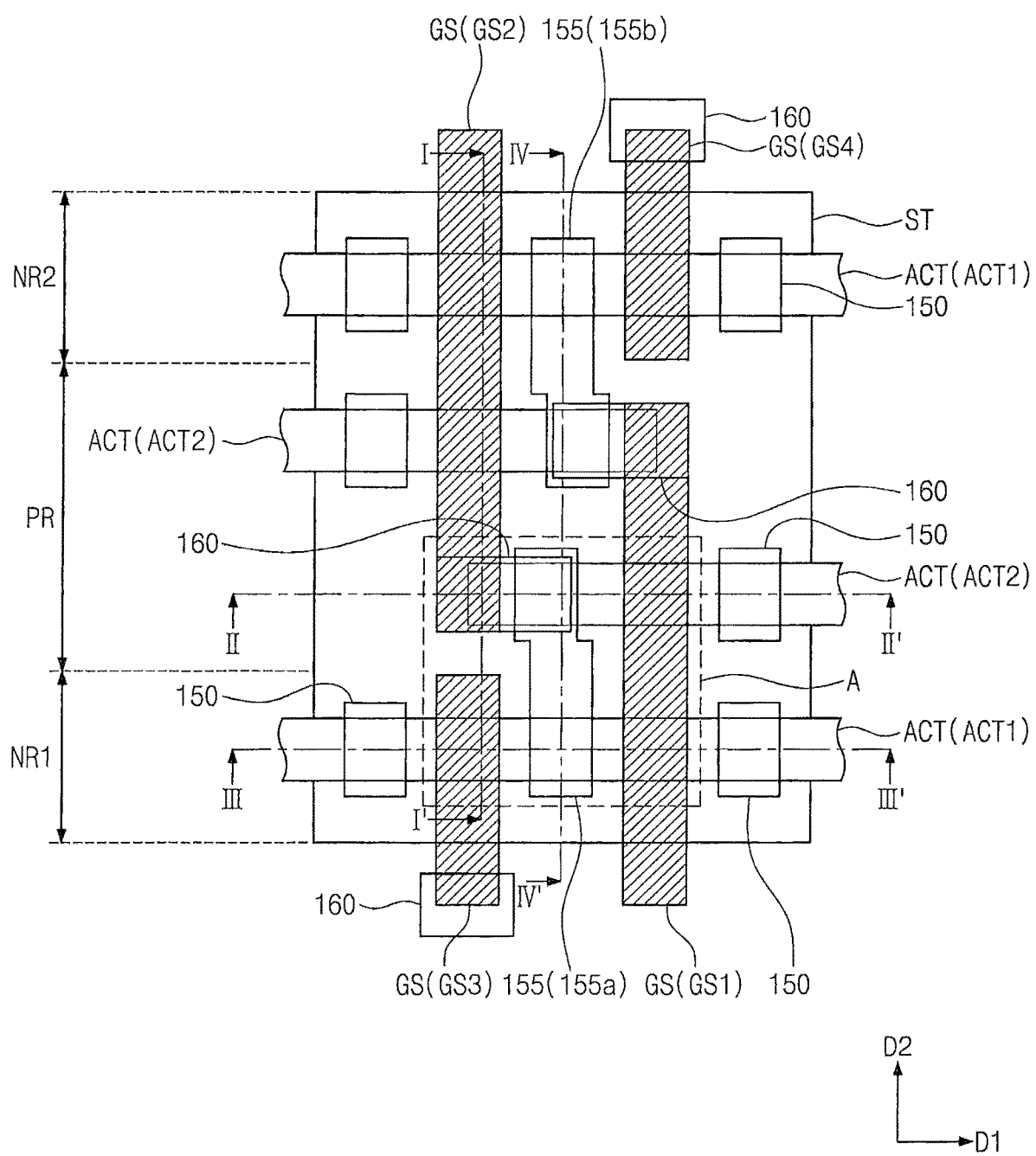
FIG. 2 is a plan view illustrating a semiconductor device according to exemplary embodiments of the present inventive concept.
Figure 3:
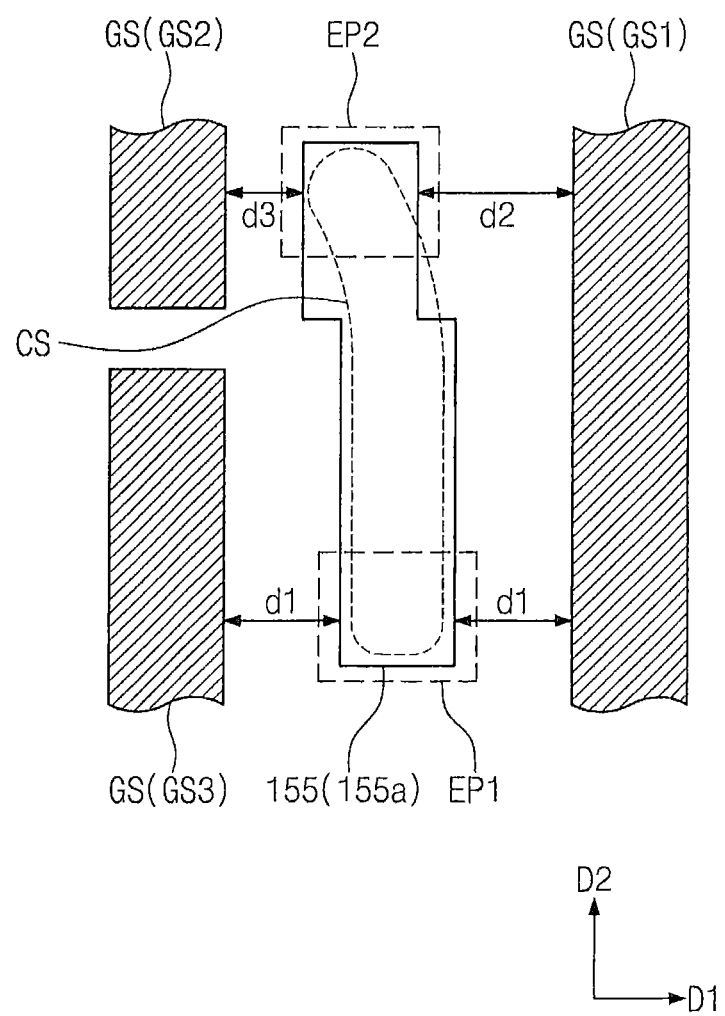
FIG. 3 is an enlarged view corresponding to section A of FIG. 2.

FIG. 2 is a plan view illustrating a semiconductor device according to exemplary embodiments of the present inventive concept. FIG. 3 is an enlarged view corresponding to section A of FIG. 2. FIGS. 4A to 4D are cross-sectional views respectively taken along lines I-I', II-II', III-III', and IV-IV' of FIG. 2.

Referring to FIGS. 2 and 4A to 4D, a substrate 100 may be provided thereon with a device isolation layer ST that defines active patterns ACT. The substrate 100 may be a semiconductor substrate. For example, the substrate 100 may be a silicon substrate, a germanium substrate, a silicon-germanium substrate, and/or a III-V group compound semiconductor substrate. The device isolation layer ST may include, for example, a silicon oxide layer. The active patterns ACT may extend in a first direction D1 and be spaced apart from each other in a second direction D2. The active patterns ACT may protrude from the substrate 100 and be separated from each other by the device isolation layer ST. Each of the active patterns ACT may have an upper portion (referred to hereinafter as an active fin AF) exposed by the device isolation layer ST.

The substrate 100 may include a PMOSFET region PR, a first NMOSFET region NR1, and a second NMOSFET region NR2. The first and second NMOSFET regions NR1 and NR2 may be separated from each other across the PMOSFET region PR. The first and second NMOSFET regions NR1 and NR2 may be spaced apart from each other in the second direction D2. The active patterns ACT may include first active patterns ACT1 provided on the first and second NMOSFET regions NR1 and NR2 and second active patterns ACT2 provided on the PMOSFET region PR. The first active patterns ACT1 may have a conductive type different from that of the second active patterns ACT2. A single first active pattern ACT1 may be provided on each of the first and second NMOSFET regions NR1 and NR2, but embodiments of the present inventive concept are not limited thereto. Differently from those shown in figures, a plurality of the first active patterns ACT1 may be provided on each of the first and second NMOSTET regions NR1 and NR2. A pair of the second active patterns ACT2 may be provided on the PMOSFET region PR, but embodiments of the present inventive concept are not limited thereto.

The substrate 100 may be provided thereon with gate structures GS running across the active patterns AP. Each of the gate structures GS may extend in the second direction D2 and cover top and side surfaces of the active fin AF of each active pattern ACT. The gate structures GS may include a first gate structure GS1, a second gate structure GS2, a third gate structure GS3, and a fourth gate structure GS4 that are horizontally spaced apart from each other. The first gate structure GS1 may be spaced apart in the first direction D1 from the second gate structure GS2. The third gate structure GS3 may be aligned in the second direction D2 with the second gate structure GS2, and the first gate structure GS1 may be spaced apart in the first direction D1 from the third gate structure GS3. The fourth gate structure GS4 may be aligned in the second direction D2 with the first gate structure GS1 and spaced apart in the first direction D1 from the second gate structure GS2. The first and second gate structures GS1 and GS2 may be spaced at a pitch the same as that between the first and third gate structures GS1 and GS3 and that between the second and fourth gate structures GS2 and GS4.

The first gate structure GS1 may extend across the first NMOSFET region NR1 and the PMOSFET region PR, and the second gate structure GS2 may extend across the second NMOSFET region NR2 and the PMOSFET region PR. The third and fourth gate structures GS3 and GS4 may be provided respectively on the first and second NMOSFET regions NR1 and NR2. Each of the first and third gate structures GS1 and GS3 may extend across the first active pattern ACT1 on the first NMOSFET region NR1. The first gate structure GS1 may extend onto the PMOSFET region PR and extend across one of the second active patterns ACT2 that is adjacent to the first NMOSFET region NR1. The first gate structure GS1 may partially overlap another of the second active patterns ACT2 that is separated from the first NMOSFET region NR1. Each of the second and fourth gate structures GS2 and GS4 may extend across the first active pattern ACT1 on the second NMOSFET region NR2. The second gate structure GS2 may extend onto the PMOSFET region PR and extend across one of the second active patterns ACT2 that is adjacent to the second NMOSFET region NR2. The second gate structure GS2 may partially overlap another of the second active patterns ACT2 that is separated from the second NMOSFET region NR2.

Each of the gate structures GS may include a gate electrode GE extending in the second direction D2, a gate dielectric pattern GI extending along a bottom surface of the gate electrode GE, a capping pattern CAP extending along a top surface of the gate electrode GE, and gate spacers GSP on sidewalls of the gate electrode GE. The gate dielectric pattern GI may extend between the gate electrode GE and the gate spacers GSP. The gate electrode GE may include a conductive material. For example, the gate electrode GE may include one or more of a doped semiconductor and a conductive metal nitride. The gate dielectric pattern GI may include a silicon oxide layer, a silicon oxynitride layer, or a high-k dielectric layer whose dielectric constant is greater than that of a silicon oxide layer. Each of the capping pattern CAP and the gate spacers GSP may include one or more of a silicon oxide layer, a silicon nitride layer, and/or a silicon oxynitride layer.

Source/drain regions SD may be provided on the active patterns ACT at opposite sides of each gate structure GS. The source/drain regions SD may include epitaxial layers grown from the active patterns ACT serving as seeds. The source/drain regions SD may include one or more of silicon germanium (SiGe), silicon (Si), and/or silicon carbide (SiC). Each of the source/drain regions SD may further include impurities. The source/drain regions SD on the PMOSFET region PR may include P-type impurities, and the source/drain regions SD on the first and second NMOSFET regions NR1 and NR2 may include N-type impurities. Each of the active patterns ACT may include the active fin AF that is provided below the gate structure GS and between the source/drain regions SD. The active fin AF may be used as a channel region.

The first gate structure GS1 and the first active pattern ACT1 extending thereacross may constitute a first pull-down transistor. The first gate structure GS1 and the second active pattern ACT2 extending thereacross may constitute a first pull-up transistor. The third gate structure GS3 and the first active pattern ACT1 extending thereacross may constitute a first access transistor. The second gate structure GS2 and the first active pattern ACT1 extending thereacross may constitute a second pull-down transistor. The second gate structure GS2 and the second active pattern ACT2 extending thereacross may constitute a second pull-up transistor. The fourth gate structure GS4 and the first active pattern ACT1 extending thereacross may constitute a second access transistor. The aforementioned six transistors may constitute the SRAM cell described with reference to FIG. 1.

The substrate 100 may be provided thereon with a first interlayer dielectric layer 170 that covers the gate structures GS and the source/drain regions SD. The gate structures GS may have top surfaces coplanar with a top surface of the first interlayer dielectric layer 170. A second interlayer dielectric layer 180 may be provided on the first interlayer dielectric layer 170. Each of the first and second interlayer dielectric layers 170 and 180 may include, for example, one or more of a silicon oxide layer, a silicon nitride layer, a silicon oxynitride layer, or a low-k dielectric layer.

The substrate 100 may be provided thereon with source/drain contacts 150 and node contacts 155. The source/drain contacts 150 and the node contacts 155 may each be provided to penetrate the first and second interlayer dielectric layers 170 and 180. Each of the source/drain contacts 150 may be connected to a corresponding one of the source/drain regions SD. The node contacts 155 may include a first node contact 155a extending across the first NMOSFET region NR1 and the PMOSFET region PR and a second node contact 155b extending across the second NMOSFET region NR2 and the PMOSFET region PR. The first node contact 155a may electrically connect a corresponding source/drain region SD on the first NMOSFET region NR1 to a corresponding source/drain region SD on the PMOSFET region PR. The first node contact 155a may extend onto the device isolation layer ST between the first NMOSFET region NR1 and the PMOSFET region PR. The second node contact 155b may electrically connect a corresponding source/drain region SD on the second NMOSFET region NR2 to a corresponding source/drain region SD on the PMOSFET region PR. The second node contact 155b may extend onto the device isolation layer ST between the second NMOSFET region NR2 and the PMOSFET region PR.

Referring to FIGS. 2 and 3, the first node contact 155a may be provided between the first and third gate structures GS1 and GS3 and between the first and second gate structures GS1 and GS2. The first node contact 155a may overlap the first active pattern ACT1 on the first NMOSFET region NR1, and extend onto the PMOSFET region PR to overlap one of the second active patterns ACT2 that is adjacent to the first NMOSFET region NR1. The first node contact 155*a* may include a first end EP1 and a second end EP2 opposite to each other. For example, the first end EP1 may be a portion of the first node contact 155*a*, which is provided on the first NMOSFT region NR1, and the second end EP2 may be another portion of the first node contact 155*a*, which is provided on the PMOSFET region PR. The first end EP1 may adjoin the first active pattern ACT1 on the first NMOSFET region NR1, and the second end EP2 may adjoin the second active pattern ACT2 adjacent to the first NMOSFET region NR1.

The first end EP1 may be spaced apart at a first distance d1 from each of the first and third gate structures GS1 and GS3. The second end EP2 may laterally shift from the first end EP1 to lie closer to the second gate structure GS2 than to the first gate structure GS1. The second end EP2 may be spaced apart from the first gate structure GS1 at a second distance d2 greater than the first distance d1. The second end EP2 may be spaced apart from the second gate structure GS2 at a third distance d3 less than the first and second distances d1 and d2. Each of the first to third distances d1, d2, and d3 may be measured in the first direction D1. The first node contact 155*a* may have, as viewed in plan, a bent line shape extending in the second direction D2. For example, as viewed in plan, the first node contact 155*a* may have a non-straight line shape CS in which at least a portion of the first node contact 155*a* is curved to allow the second end EP2 to adjoin the second gate structure GS2.

Referring back to FIGS. 2 and 4A to 4D, the second node contact 155*b* may be provided between the second and fourth gate structures GS2 and GS4 and between the first and second gate structures GS1 and GS2. The second node contact 155*b* may overlap the first active pattern ACT1 on the second NMOSFET region NR2, and extend onto the PMOSFET region PR to overlap one of the second active patterns ACT2 that is adjacent to the second NMOSFET region NR2. The second node contact 155*b* may have a shape symmetrical to that of the first node contact 155*a*. The second node contact 155*b* may include a first end provided on the second NMOSFET region NR2 and a second end provided on the PMOSFET region PR. The first end of the second node contact 155*b* may adjoin the first active pattern ACT on the second NMOSFET region NR2, and the second end of the second node contact 155*b* may adjoin the second active pattern ACT2 adjacent to the second NMOSFET region NR2. The first end of the second node contact 155*b* may be spaced apart at the first distance d1 from each of the second and fourth gate structures GS2 and GS4. The second end of the second node contact 155*b* may laterally shift from the first end of the second node contact 155*b* to lie closer to the first gate structure GS1 than to the second gate structure GS2. The second end of the second node contact 155*b* may be spaced apart at the second distance d2 from the second gate structure GS2 and at the third distance d3 from the first gate structure GS1.

Gate contacts 160 may be provided on the gate structures GS. Each of the gate contacts 160 may penetrate the second interlayer dielectric layer 180 and be connected to the gate electrode GE of each gate structure GS. The gate contact 160 on the second gate structure GS2 may overlap the first node contact 155*a* in a plan view. The gate contact 160 on the second gate structure GS2 may be connected to the first node contact 155*a* and the gate electrode GE of the second gate structure GS2. Accordingly, the gate electrode GE of the second gate structure GS2 may be electrically connected to the substrate 100 through the gate contact 160 and the first node contact 155*a*. That is, the gate electrode GE of the second gate structure GS2 may be electrically connected to the first and second active patterns ACT1 and ACT2 that are mutually connected through the first node contact 155*a*. The gate contact 160 on the first gate structure GS1 may overlap the second node contact 155*b* in a plan view. The gate contact 160 on the first gate structure GS1 may be connected to the second node contact 155*b* and the gate electrode GE of the first gate structure GS1. Accordingly, the gate electrode GE of the first gate structure GS1 may be electrically connected to the substrate 100 through the gate contact 160 and the second node contact 155*b*. That is, the gate electrode GE of the first gate structure GS1 may be electrically connected to the first and second active patterns ACT1 and ACT2 that are mutually connected through the second node contact 155*b*. It may, therefore, be possible to provide the latch structure of the SRAM cell discussed with reference to FIG. 1.

The source/drain contacts 150, the node contacts 155, and the gate contacts 160 may have their top surfaces substantially coplanar with a top surface of the second interlayer dielectric layer 180. The source/drain contacts 150, the node contacts 155, and the gate contacts 160 may include the same conductive material. The source/drain contacts 150, the node contacts 155, and the gate contacts 160 may include, for example, one or more of a doped semiconductor, a metal, and a conductive metal nitride. Although not shown, the second interlayer dielectric layer 180 may be provided thereon with electrical lines that are electrically connected to the source/drain contacts 150 and the gate contacts 160. The electrical lines may provide the source/drain regions SD and the gate electrodes GE with voltages through the source/drain contacts 150 and the gate contacts 160.

The increase, in integration of semiconductor devices may problematically cause electrical shorts between gate electrodes and their adjacent node contacts constituting SRAM cells.

According to some embodiments of the present inventive concept, the first node contact 155*a* (or the second node contact 155*b*) may include the first end EP1 and the second end EP2 laterally shifted from the first end EP1. In this configuration, the first node contact 155*a* may be positioned closer to a specific gate structure than to its adjacent gate structures. The first node contact 155*a* may be electrically connected through the gate contact 160 to the specific gate structure, and spaced apart at a desired distance from the adjacent gate structures. As a result, electrical shorts may be prevented, reduced, or minimized between the first node contact 155*a* and the adjacent gate structures.

FIGS. 5A to 9A are cross-sectional views corresponding to line I-I' of FIG. 2 illustrating a method of fabricating a semiconductor device according to exemplary embodiments of the present inventive concept. FIGS. 5B to 9B are cross-sectional views corresponding to line II-II' of FIG. 2 illustrating a method of fabricating a semiconductor device according to exemplary embodiments of the present inventive concept. FIGS. 5C to 9C are cross-sectional views corresponding to line of FIG. 2 illustrating a method of fabricating a semiconductor device according to exemplary embodiments of the present inventive concept. FIGS. 5D to 9D are cross-sectional views corresponding to line IV-IV' of FIG. 2 illustrating a method of fabricating a semiconductor device according to exemplary embodiments of the present inventive concept.

Referring to FIGS. 2 and 5A to 5D, a substrate 100 may be patterned to form trenches T defining active patterns ACT. The active patterns ACT may extend in the first direction D1 and be spaced apart from each other in the second direction D2. The formation of the trenches T may include forming mask patterns (not shown) on the substrate 100 and anisotropically etching the substrate 100 using the mask patterns as an etch mask. A device isolation layer ST may be formed to fill the trenches T. The formation of the device isolation layer ST may include forming on the substrate 100 an insulation layer to fill the trenches T and planarizing the insulation layer until the mask patterns are exposed. An upper portion of the device isolation layer ST may be recessed to expose an upper portion of each active pattern ACT. The exposed upper portion of each active pattern ACT may be defined as an active fin AF. When the upper portion of the device isolation layer ST is recessed, the mask patterns may be removed and top surfaces of the active patterns ACT may be exposed.

The substrate 100 may include a PMOSFET region PR, a first NMOSFET region NR1, and a second NMOSFET region NR2. The first and second NMOSFET regions NR1 and NR2 may be separated from each other across the PMOSFET region PR. The device isolation layer ST may be formed to have substantially the same depth in a direction perpendicular to a top surface of the substrate 100. Alternatively, the device isolation layer ST may be formed to have portions, between the PMOSFET region PR and the first NMOSFET region NR1 and between the PMOSFET region PR and the second NMOSFET region NR2, whose depths are greater than those of other portions thereof.

The active patterns ACT may include first active patterns ACT1 provided on the first and second NMOSFET regions NR1 and NR2 and second active patterns ACT2 provided on the PMOSFET region PR. The first active patterns ACT1 may have a conductivity type different from that of the second active patterns ACT2.

Referring to FIGS. 2 and 6A to 6D, sacrificial gate structures SGS may be formed on the substrate 100 to extend across the active patterns ACT. Each of the sacrificial gate structures SGS may extend in the second direction D2. As viewed in plan, an arrangement of the sacrificial gate structures SGS may be the same as that of the gate structures GS discussed with reference to FIGS. 2 and 4A to 4D. Each of the sacrificial gate structures SGS may include an etch stop pattern 102, a sacrificial gate pattern 110, and a sacrificial mask pattern 112 that are sequentially stacked on the substrate 100. Each of the sacrificial gate structures SGS may further include gate spacers GSP on sidewalls of the sacrificial gate pattern 110.

The formation of the sacrificial gate structures SGS may include sequentially forming an etch stop layer and a sacrificial gate layer on the substrate 100, forming the sacrificial mask pattern 112 on the sacrificial gate layer, and patterning the sacrificial gate layer and the etch stop layer using the sacrificial mask pattern 112 as an etch mask. The etch stop layer may include, for example, silicon oxide. The sacrificial gate layer may include a material exhibiting an etch selectivity with respect to the etch stop layer. The sacrificial gate layer may include, for example, polysilicon. The sacrificial mask pattern 112 may include a material exhibiting an etch selectivity with respect to the sacrificial gate layer. The sacrificial mask pattern 112 may include, for example, silicon nitride. The sacrificial gate layer and the etch stop layer may be patterned to respectively form the sacrificial gate pattern 110 and the etch stop pattern 102. After the sacrificial gate pattern 110 and the etch stop pattern 102 are formed, the gate spacers GSP may be formed on the sidewalls of the sacrificial gate pattern 110. The formation of the gate spacers GSP may include forming on the substrate 100 a gate spacer layer to cover the sacrificial mask pattern 112, the sacrificial gate pattern 110, and the etch stop pattern 102 and then performing an anisotropic etching process on the gate spacer layer. The gate spacer layer may include, for example, silicon nitride. The anisotropic etching process of the gate spacer layer may expose the active patterns ACT at opposite sides of each sacrificial gate structure SGS and a top surface of the device isolation layer ST at opposite sides of each sacrificial gate structure SGS. The anisotropic etching process of the gate spacer layer may further expose a top surface of the sacrificial mask pattern 112 of each sacrificial gate structure SGS.

Source/drain regions SD may be formed on the active patterns ACT at opposite sides of each sacrificial gate structure SGS. The formation of the source/drain regions SD may include performing a selective epitaxial growth process on the substrate 100. The source/drain regions SD may include one or more of silicon germanium (SiGe), silicon (Si), and silicon carbide (SiC), which can be grown from the active patterns ACT serving as seeds. The source/drain regions SD may be doped with impurities either simultaneously with or after the epitaxial process. The source/drain regions SD on the PMOSFET region PR may include P-type impurities, and the source/drain regions SD on the first and second NMOSFET regions NR1 and NR2 may include N-type impurities. Each of the active patterns ACT may include the active fin AF that is provided below the sacrificial gate structure SGS and between the source/drain regions SD. The active fin AF may be used as a channel region.

A first interlayer dielectric layer 170 may then be formed on the substrate 100. The first interlayer dielectric layer 170 may cover the sacrificial gate structures SGS and the source/drain regions SD. The first interlayer dielectric layer 170 may include, for example, one or more of a silicon oxide layer, a silicon nitride layer, a silicon oxynitride layer, and a low-k dielectric layer.

Referring to FIGS. 2 and 7A to 7D, an upper portion of the first interlayer dielectric layer 170 may be etched to expose a top surface of the sacrificial gate pattern 110 of each sacrificial gate structure SGS. When the first interlayer dielectric layer 170 is etched, the sacrificial mask pattern 112 of each sacrificial gate structure SGS and upper portions of the gate spacers GSP may be removed. Thereafter, the sacrificial gate pattern 110 may be removed from each of the sacrificial gate structures SGS. Accordingly, a gap 190 may be formed between the gate spacers GSP. The gap 190 may expose the active fin AF of each active pattern ACT. The formation of the gap 190 may include removing the sacrificial gate pattern 110 by performing an etching process having an etch selectivity with respect to the gate spacers GSP, the first interlayer dielectric layer 170, and the etch stop pattern 102 and then exposing the active fin AF by removing the etch stop pattern 102.

A gate dielectric pattern GI and a gate electrode GE may be formed to fill the gap 190. In detail, a gate dielectric layer may be formed on the first interlayer dielectric layer 170 to partially fill the gap 190. The gate dielectric layer may be formed to cover the active fin AF. The gate dielectric layer may include at least one high-k dielectric layer. For example, the gate dielectric layer may include one or more of hafnium oxide, hafnium silicate, zirconium oxide, and zirconium silicate, but embodiments of the present inventive concept are not limited to these materials. The gate dielectric layer may be formed by performing, for example, an atomic layer deposition process. A gate layer may be formed on the gate dielectric layer to fill a remaining portion of the gap 190. The gate layer may include one or more of a conductive metal nitride (e.g., titanium nitride, tantalum nitride, etc.) and a metal (e.g., aluminum, tungsten, etc.). The gate dielectric layer and the gate layer may be planarized to form the gate dielectric pattern GI and the gate electrode GE in the gap 190. The planarization process may expose a top surface of the first interlayer dielectric layer 170 and top surfaces of the gate spacers GSP. The gate dielectric pattern GI may extend along a bottom surface of the gate electrode GE, and be interposed between the gate electrode GE and the gate spacers GSP.

An upper portion of each of the gate dielectric pattern GI and the gate electrode GE may be recessed to form a recessed region in the gap 190. The recessed region may expose inner surfaces of the gate spacers GSP. A capping pattern CAP may be formed to fill the recessed region. The capping pattern CAP may cover the recessed top surface of each of the gate dielectric pattern GI and the gate electrode GE, and also cover the exposed inner surfaces of the gate spacers GSP.

A gate structure GS may be defined to include the gate dielectric pattern GI, the gate electrode GE, the capping pattern CAP, and the gate spacers GSP. The substrate 100 may be provided thereon with a plurality of the gate structures GS horizontally spaced apart from each other. The plurality of the gate structures GS may include a first gate structure GS1, a second gate structure GS2, a third gate structure GS3, and a fourth gate structure GS4 as discussed with reference to FIGS. 2 and 4A to 4D.

Referring back to FIGS. 2 and 8A to 8D, a second interlayer dielectric layer 180 may be formed on the first interlayer dielectric layer 170. The second interlayer dielectric layer 180 may include, for example, one or more of a silicon oxide layer, a silicon nitride layer, a silicon oxynitride layer, and a low-k dielectric layer.

Source/drain contact holes 150H and node contact holes 155H may be formed to penetrate the first and second interlayer dielectric layers 170 and 180. The source/drain contact holes 150H and the node contact holes 155H may expose the source/drain regions SD at opposite sides of each gate structure GS. Each of the source/drain contact holes 150H may expose a corresponding one of the source/drain regions SD. One of the node contact holes 155H may extend along a top surface of the device isolation layer ST so as to expose a corresponding source/drain region SD on the first NMOSFET region NR1 and a corresponding source/drain region SD on the PMOSFET region PR. Another of the node contact holes 155H may extend along the top surface of the device isolation layer ST so as to expose a corresponding source/drain region SD on the second NMOSFET region NR2 and a corresponding source/drain region SD on the PMOSFET region PR.

The source/drain contact holes 150H and the node contact holes 155H may be formed by a first exposure process using a first photomask. The formation of the source/drain contact holes 150H and the node contact holes 155H may include forming a photoresist layer on the second interlayer dielectric layer 180, performing the first exposure process on the photoresist layer to form a photoresist pattern having openings that define areas where the source/drain contact holes 150I and the node contact holes 155H are formed, etching the first and second interlayer dielectric layers 170 and 180 using the photoresist pattern as an etch mask, and removing the photoresist pattern. The first photomask may define a planar shape of each of the source/drain contact holes 150I1 and the node contact holes 155H.

Referring to FIGS. 2 and 9A to 9D, a mask layer (not shown) may be formed on the second interlayer dielectric layer 180 to fill the source/drain contact holes 150H and the node contact holes 155H. The mask layer (not shown) may be, for example, an SOH layer.

Gate contact holes 160 may be formed on corresponding gate structures GS. Each of the gate contact holes 160H may penetrate the mask layer and second interlayer dielectric layer 180 to expose the gate electrode GE of each gate structure GS. As viewed in plan, one of the gate contact holes 160H, which is provided on the second gate structure GS2, may overlap one of the node contact holes 155H. The gate contact hole 160H on the second gate structure GS2 may be spatially connected to the one of the node contact holes 155H. As viewed in plan, one of the gate contact holes 160H, which is provided on the first gate structure GS1, may overlap another of the node contact holes 155H. The gate contact hole 160H on the first gate structure GS1 may be spatially connected to the other of the node contact holes 155H.

The gate contact holes 160H may be formed by a second exposure process using a second photomask. The formation of the gate contact holes 160H may include forming a photoresist layer on the mask layer, performing the second exposure process on the photoresist layer to form a photoresist pattern having openings that define areas where the gate contact holes 160H are formed, etching the mask layer and the second interlayer dielectric layer 180 using the photoresist pattern as an etch mask, and removing the photoresist pattern. The second photomask may define a planar shape of each gate contact hole 160H.

Thereafter, the mask layer may be removed. The removal of the mask layer may include performing, for example, an ashing process and/or a strip process.

Referring back to FIGS. 2 and 4A to 4D, a conductive layer may be formed on the second interlayer dielectric layer 180 to fill the source/drain contact holes 150H, the node contact holes 155H, and the gate contact holes 160H. The conductive layer may include one or more of a doped semiconductor, a metal, and a conductive metal nitride. The conductive layer may be planarized until the second interlayer dielectric layer 180 is exposed, and, thus, source/drain contacts 150, node contacts 155, and gate contacts 160 may be formed respectively in the source/drain contact holes 150H, the node contact holes 155H, and the gate contact holes 160H.

The node contacts 155 may include a first node contact 155*a* and a second node contact 155*b*. The first node contact 155*a* may be connected to a corresponding source/drain region SD on the first NMOSFET region NR1 and a corresponding source/drain region SD on the PMOSFET region PR, and may extend onto the device isolation layer ST between the first NMOSFET region NR1 and the PMOSFET region PR. The second node contact 155*b* may be connected to a corresponding source/drain region SD on the second NMOSFET region NR2 and a corresponding source/drain region SD on the PMOSFET region PR, and may extend onto the device isolation layer ST between the second NMOSFET region NR2 and the PMOSFET region PR. Each of the node contacts 155 may include, as described with reference to FIG. 3, a first end EP1 and a second end EP2 opposite to each other. The second end EP2 may shift from the first end EP1 in a direction (e.g., the first direction D1) parallel to the top surface of the substrate 100. Each of the first node contacts 155a may have, as viewed in plan, a bent line shape extending in the second direction D2.

Although not shown, the second interlayer dielectric layer 180 may be provided thereon with electrical lines that are electrically connected to the source/drain contacts 150 and the gate contacts 160.

Figure 10:
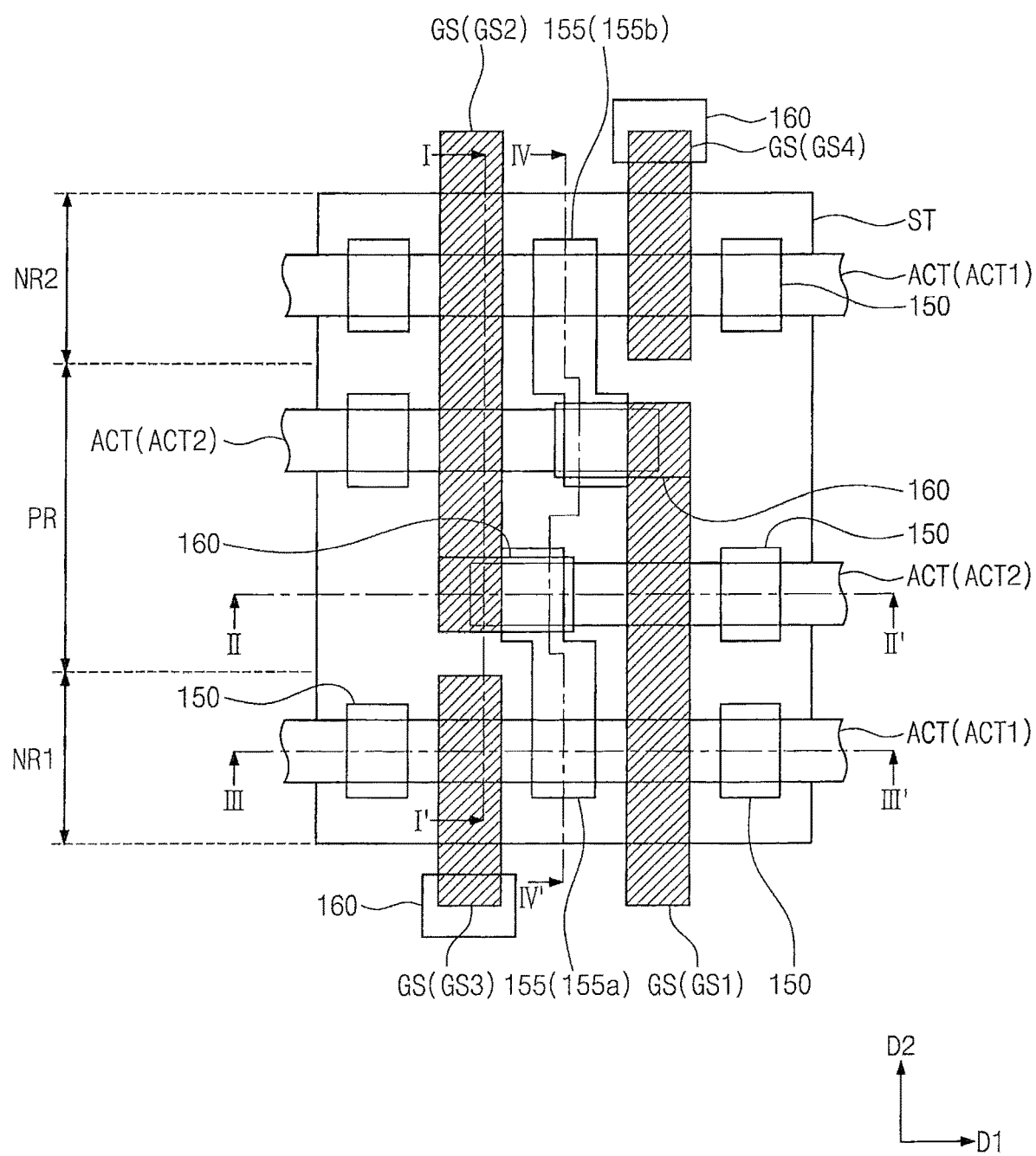
FIG. 10 is a plan view illustrating a semiconductor device according to exemplary embodiments of the present inventive concept.
Figure 11:
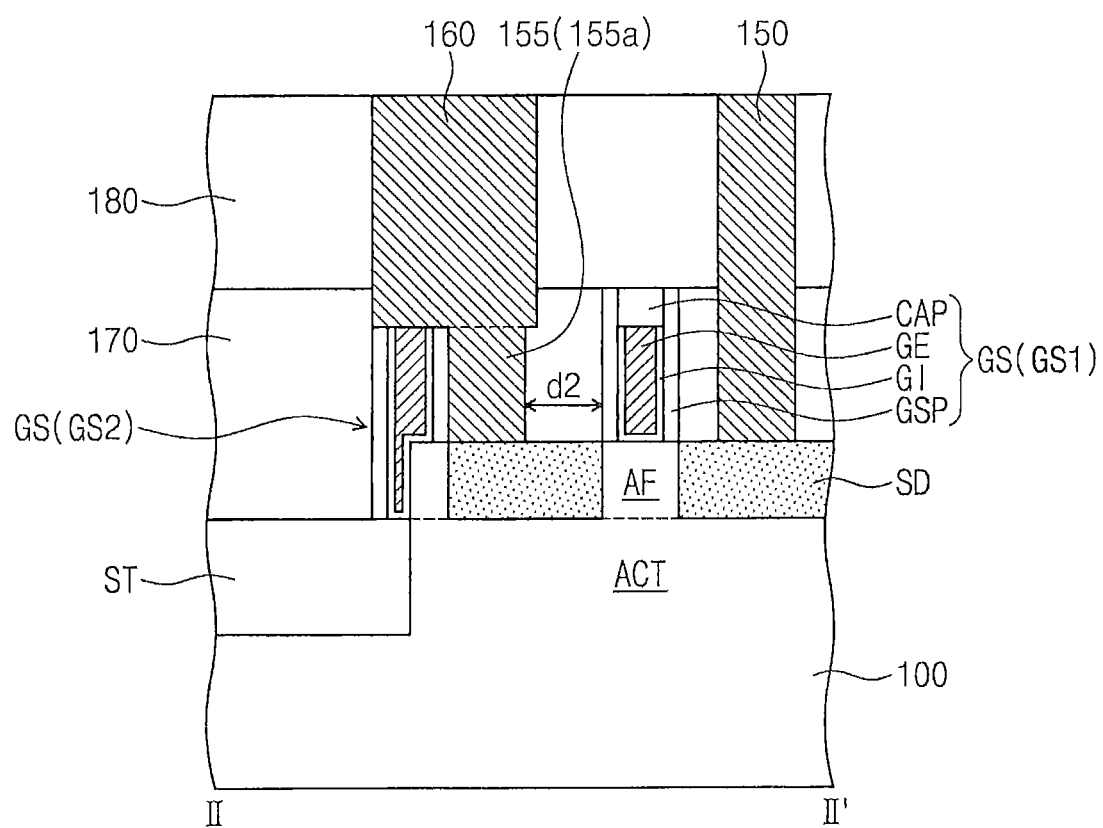
FIG. 11 is a cross-sectional view taken along line II-II' of FIG. 10.

FIG. 10 is a plan view illustrating a semiconductor device according to exemplary embodiments of the present inventive concept. FIG. 11 is a cross-sectional view taken along line II-II' of FIG. 10. Cross-sectional views obtained taken along lines I-I', III-III', and IV-IV' of FIG. 10 are substantially the same as FIGS. 4A, 4C, and 4D, respectively. Those parts of the present exemplary embodiment configurations that are the same as those of the semiconductor devices according to the foregoing exemplary embodiments described with reference to FIGS. 2, 3, and 4A to 4D are allocated the same reference numerals thereto. In the present exemplary embodiment that follows, differences from the semiconductor devices according to the foregoing exemplary embodiments described with reference to FIGS. 2, 3, and 4A to 4D will be principally explained in the interest of brevity.

Figure 4A:
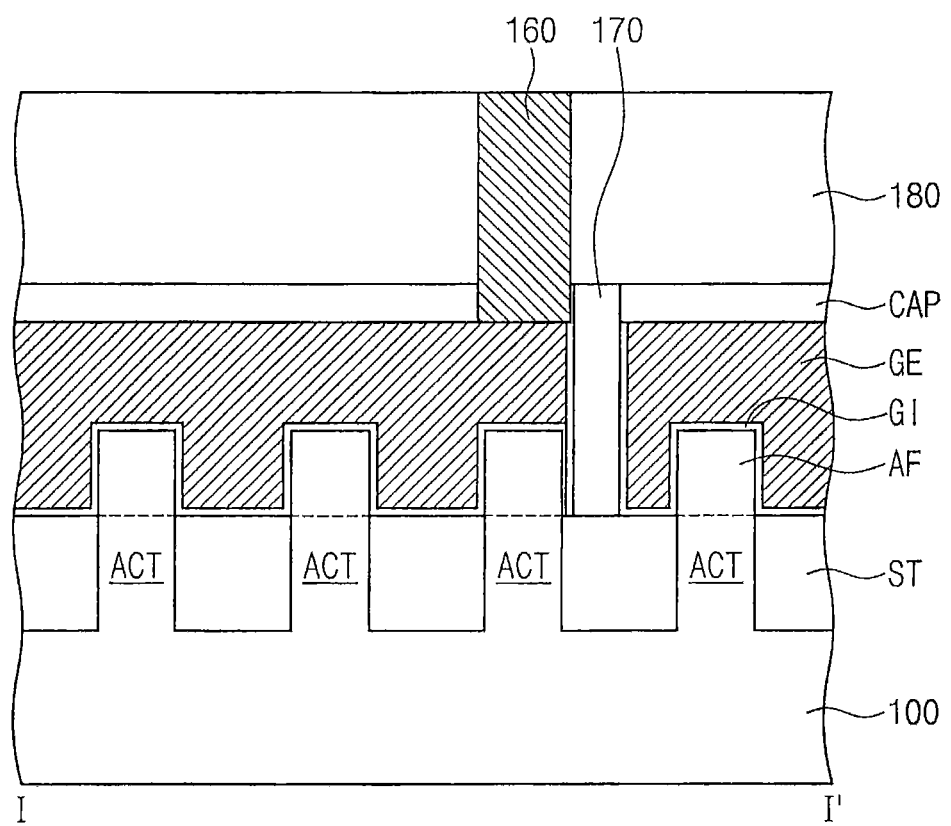
FIGS. 4A to 4D are cross-sectional views respectively taken along lines I-I', II-II', III-III', and IV-IV' of FIG. 2.
Figure 4B:
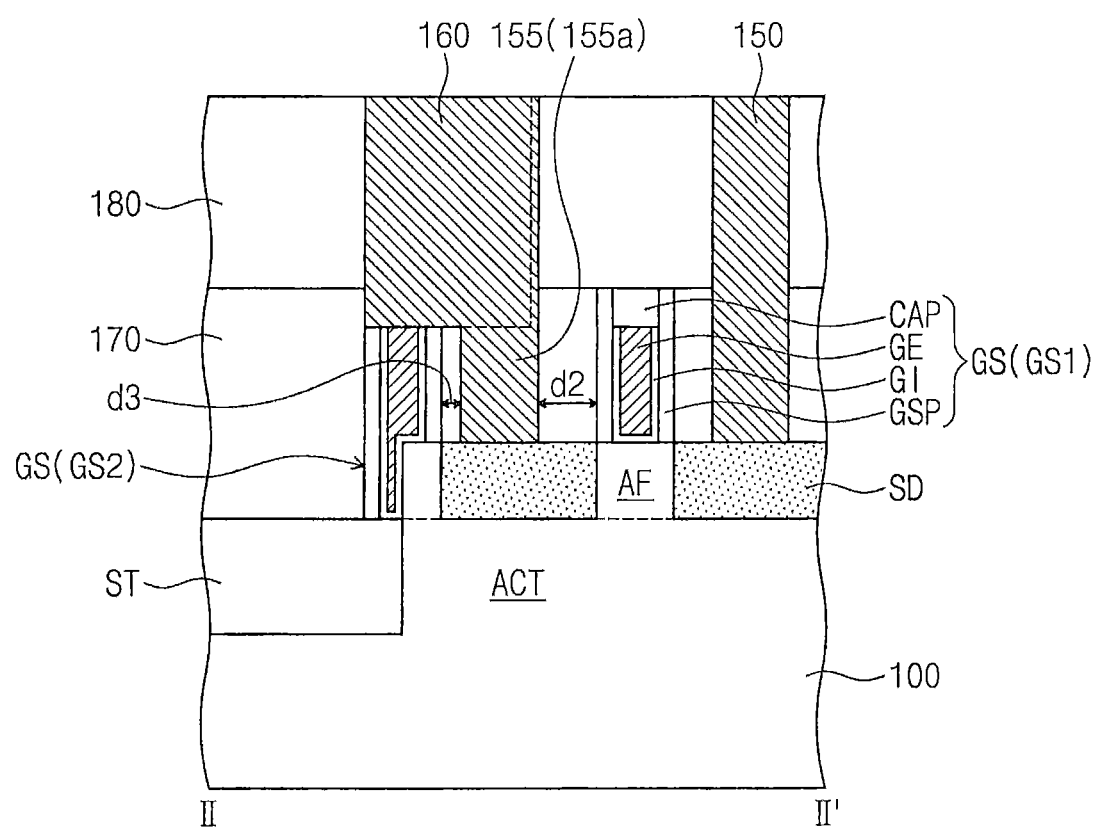
Figure 4C:
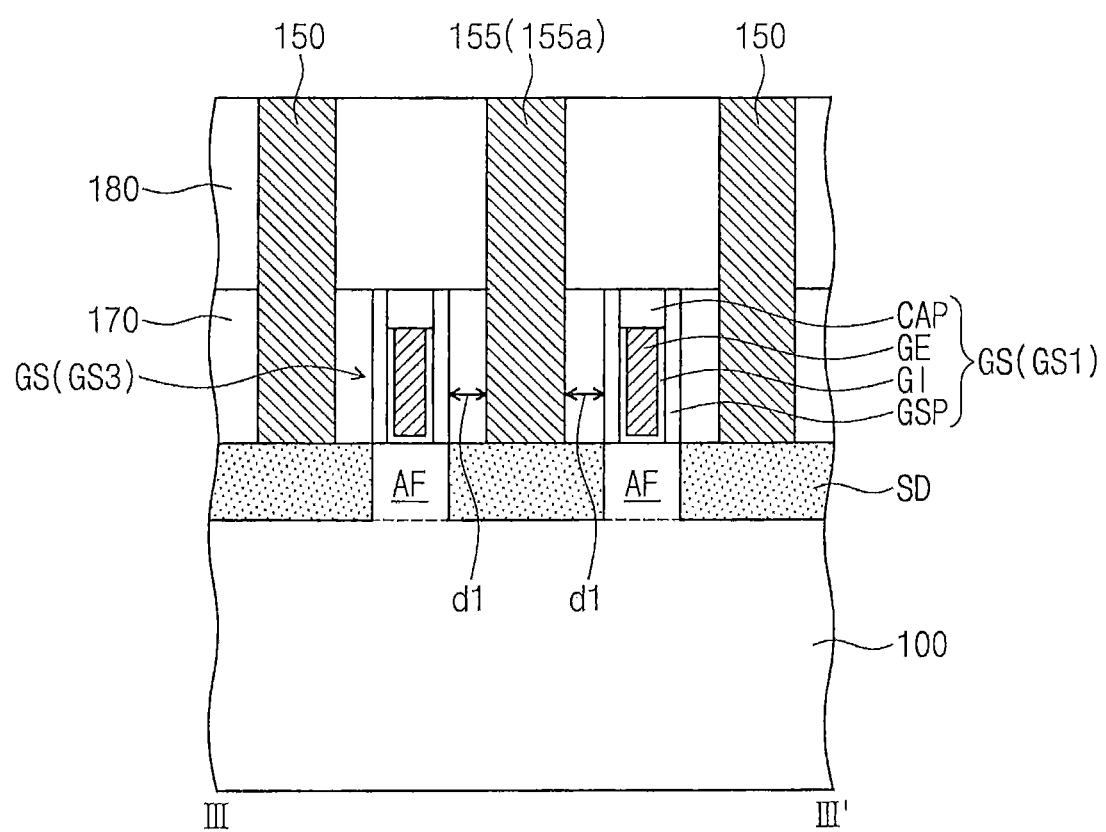
Figure 4D:
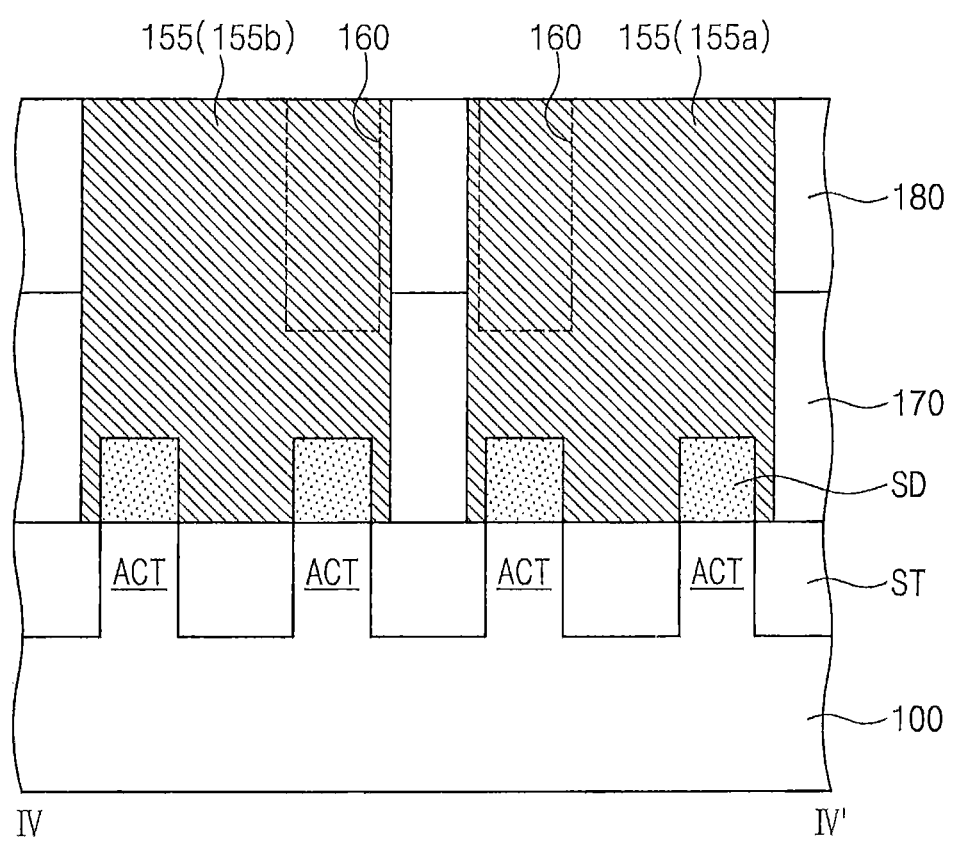
Figure 5A:
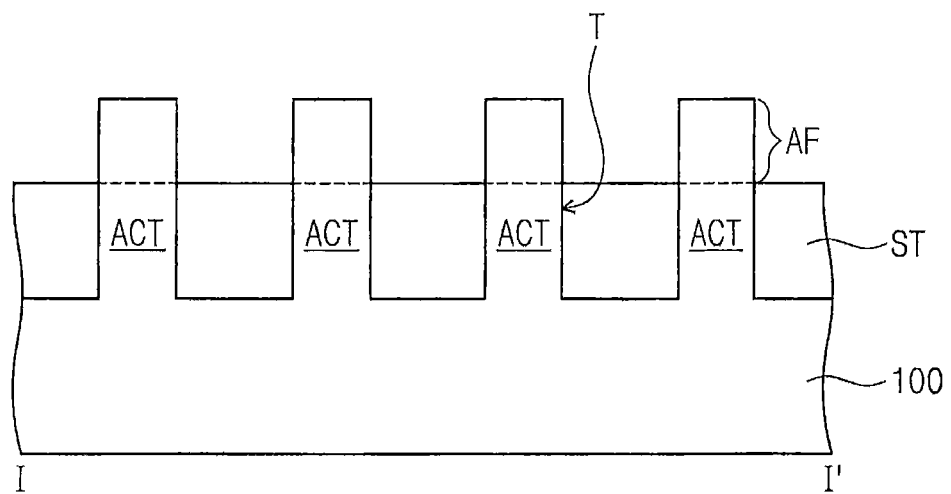
Figure 5B:
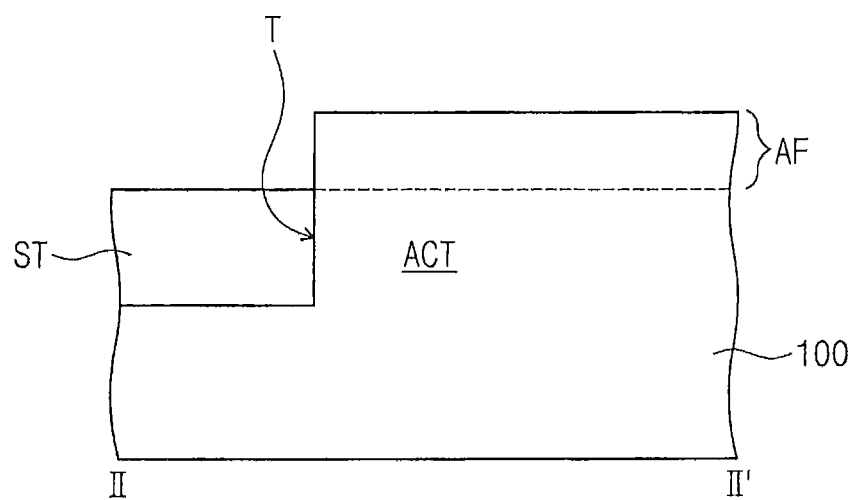
Figure 5C:
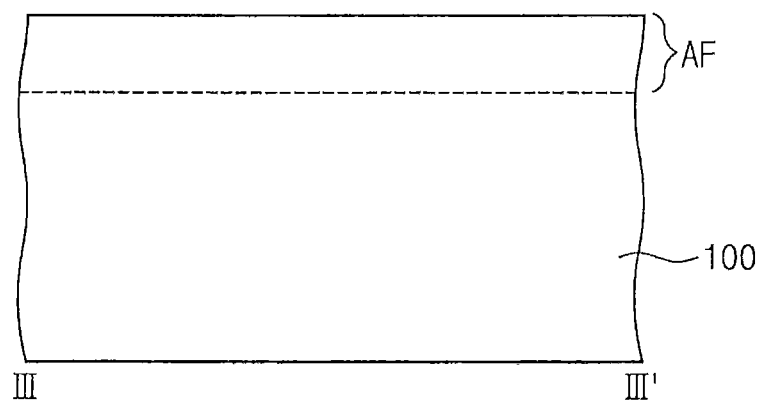
Figure 5D:
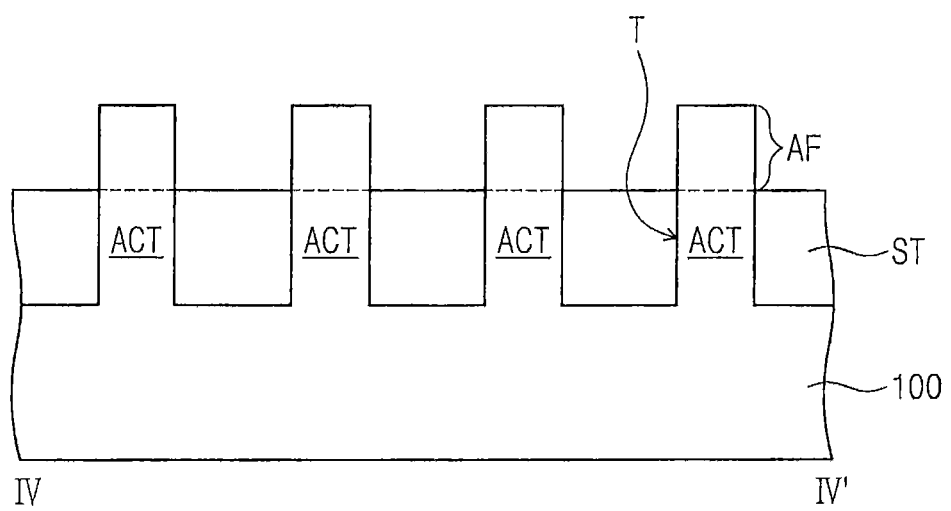
Figure 6A:
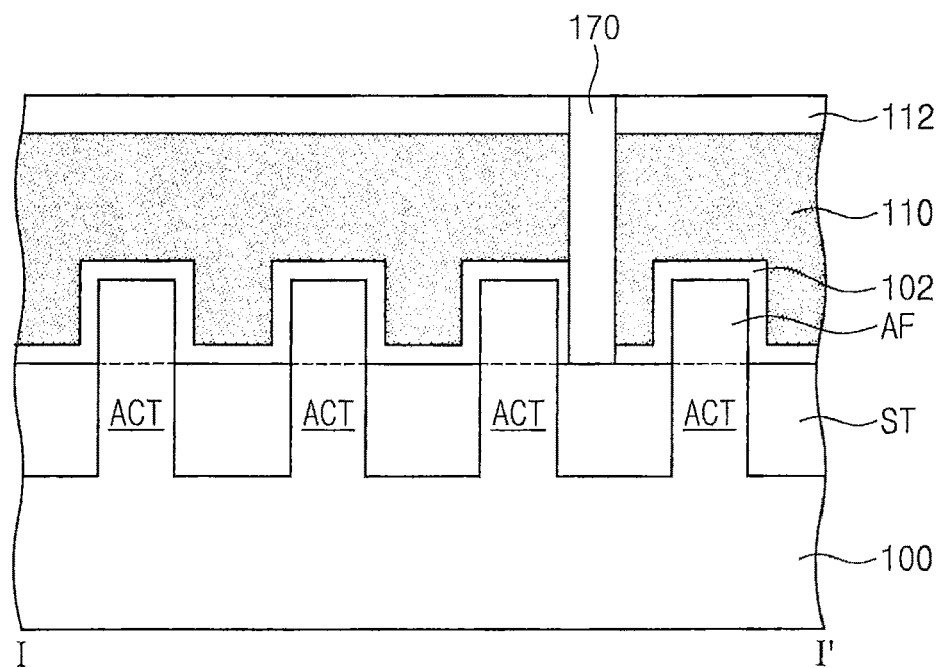
Figure 6B:
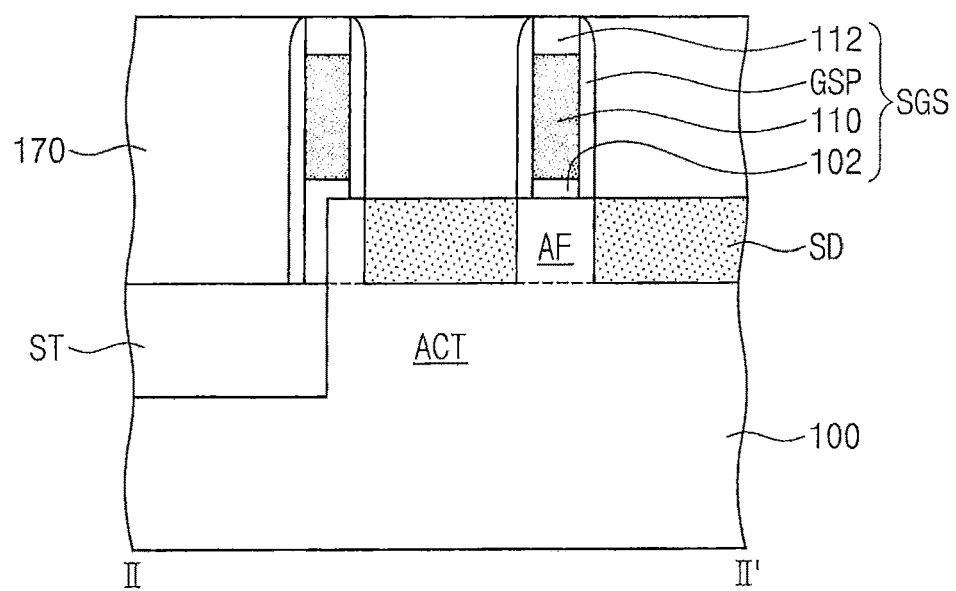
Figure 6C:
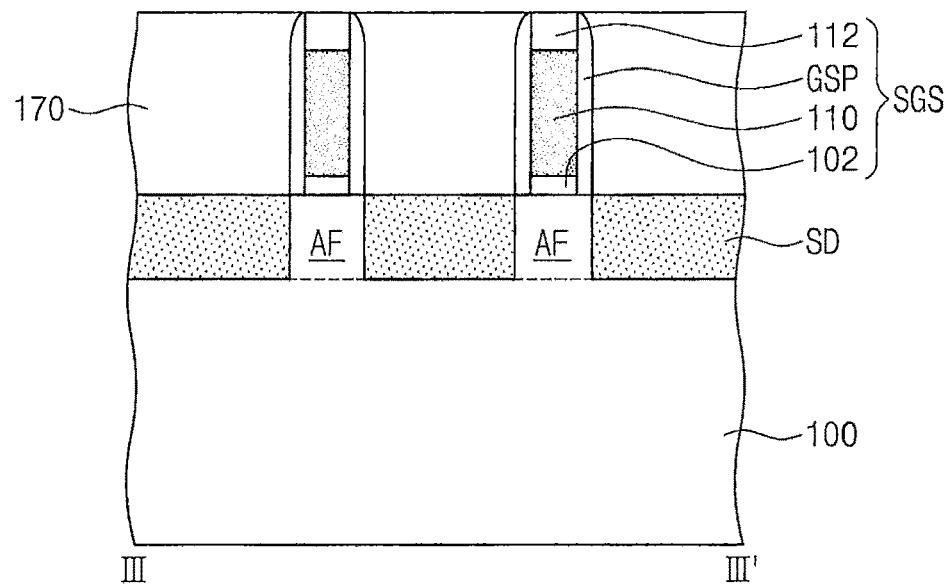
Figure 6D:
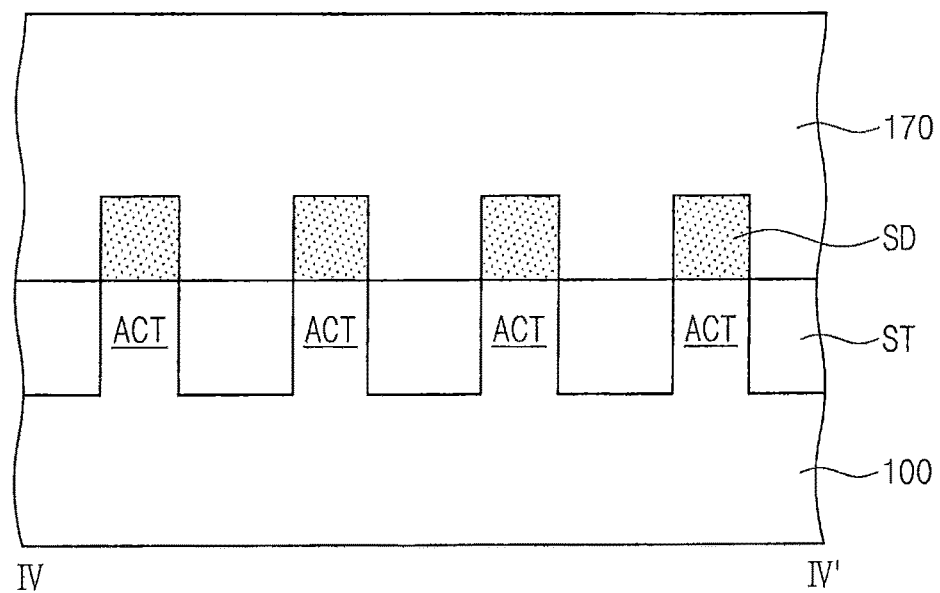
Figure 7A:
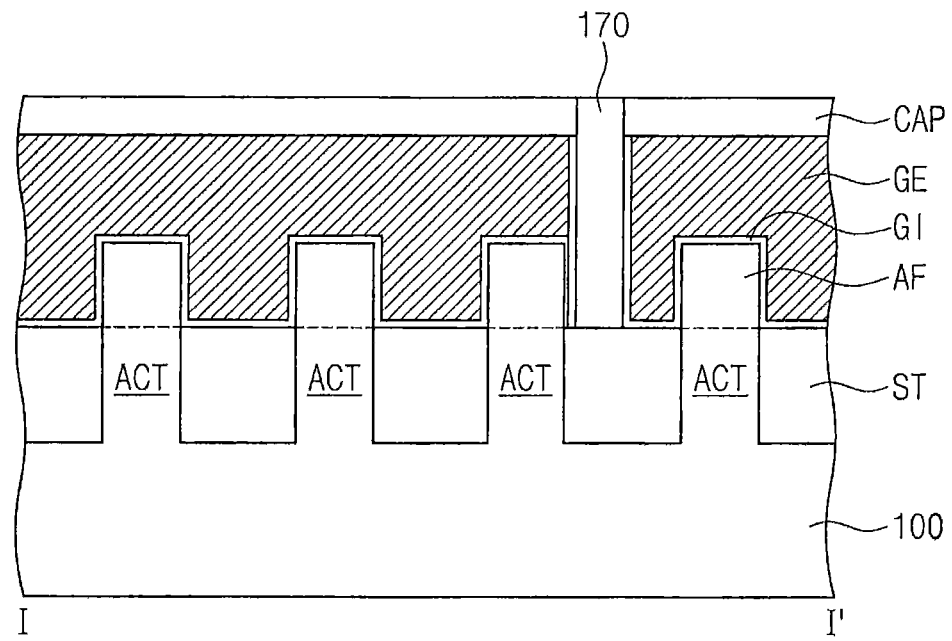
Figure 7B:
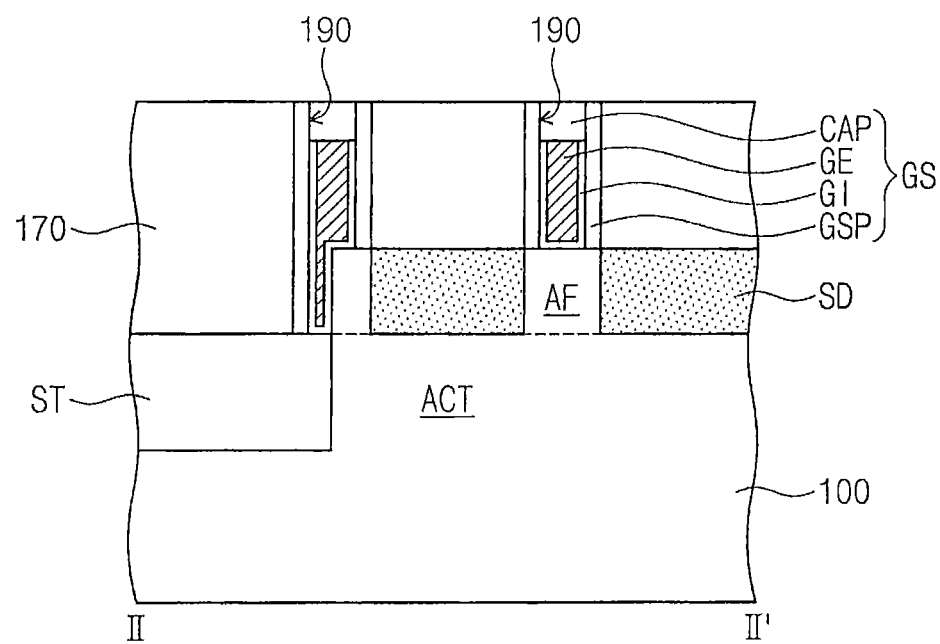
Figure 7C:
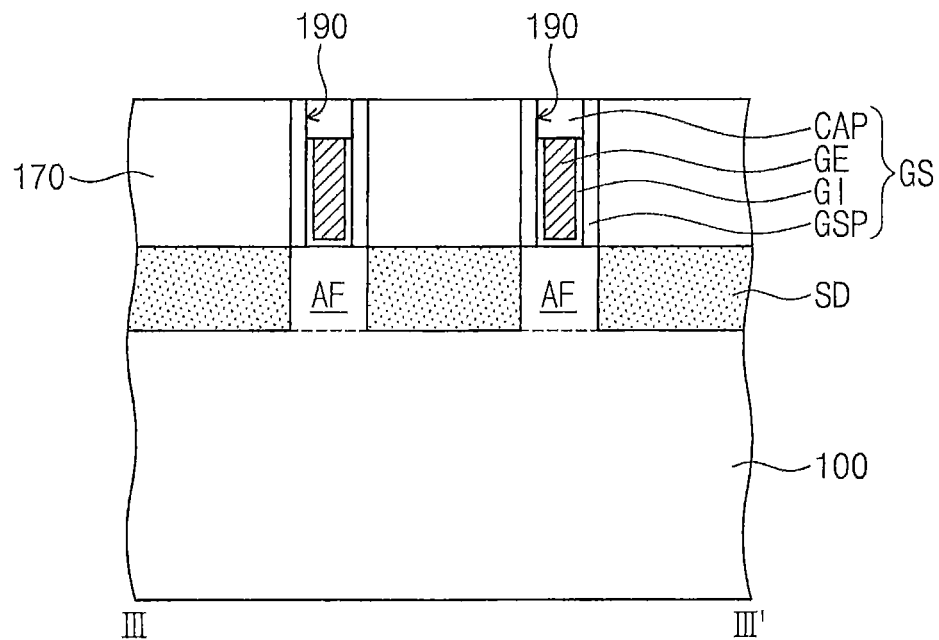
Figure 7D:
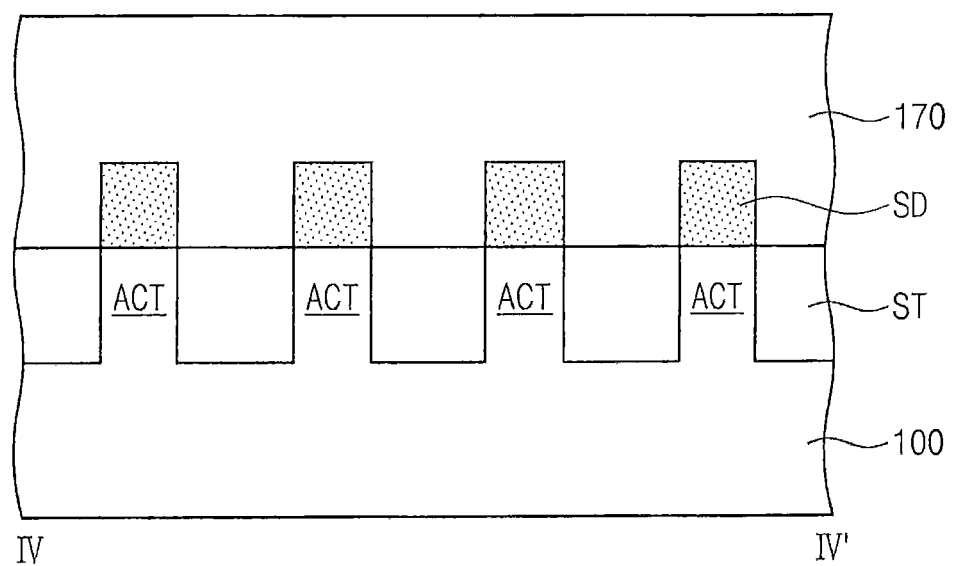
Figure 8A:
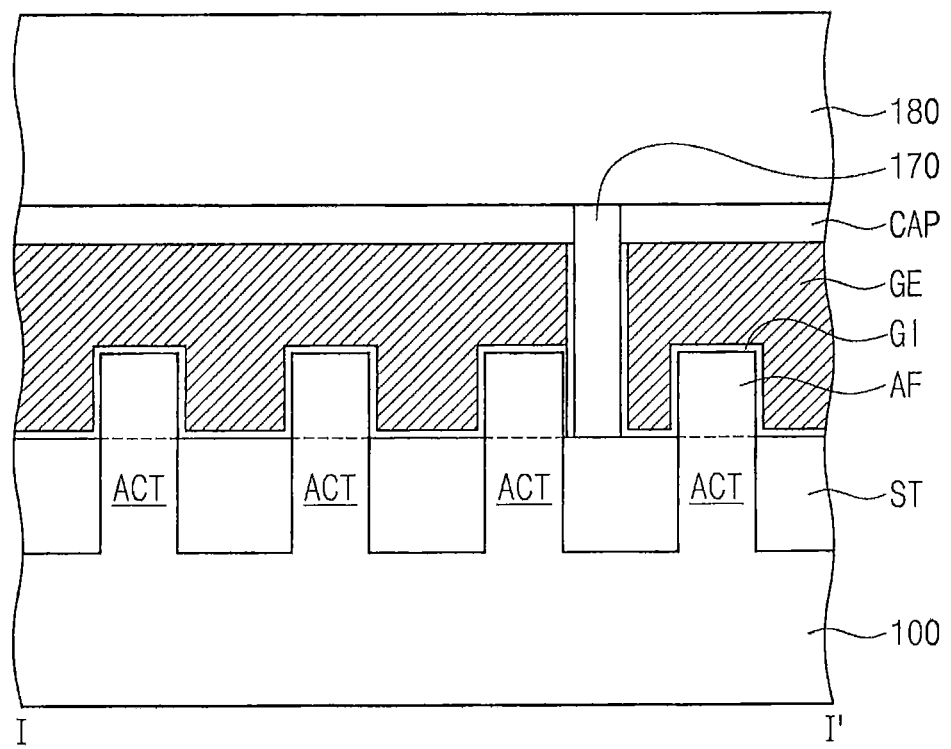
Figure 8B:
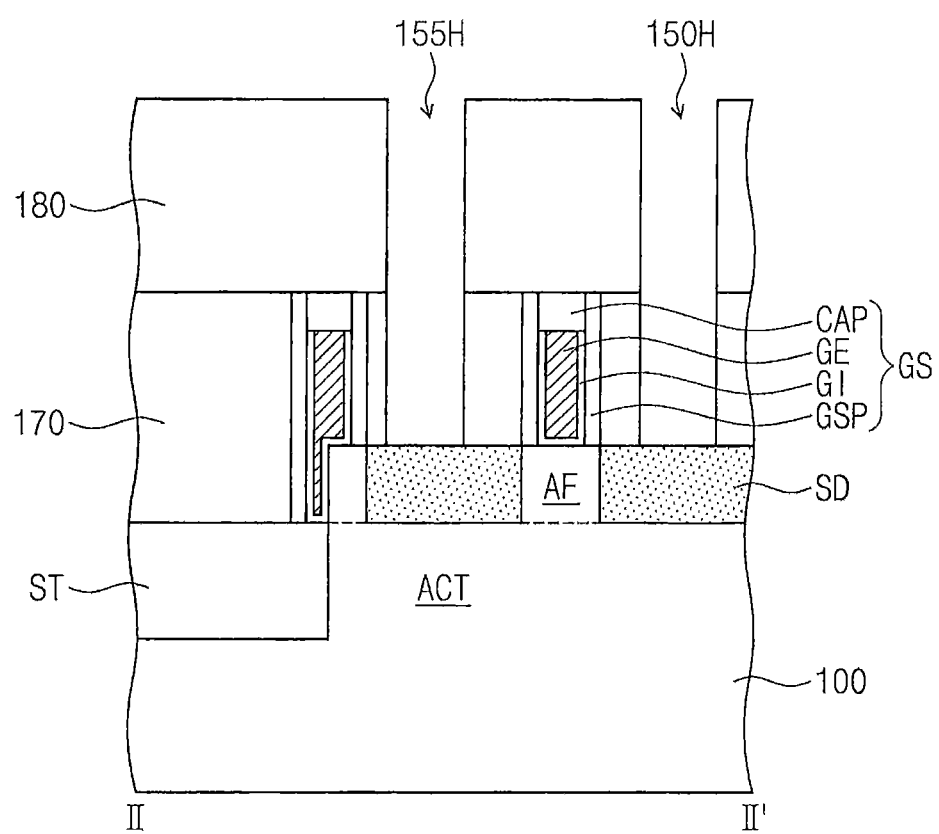
Figure 8C:
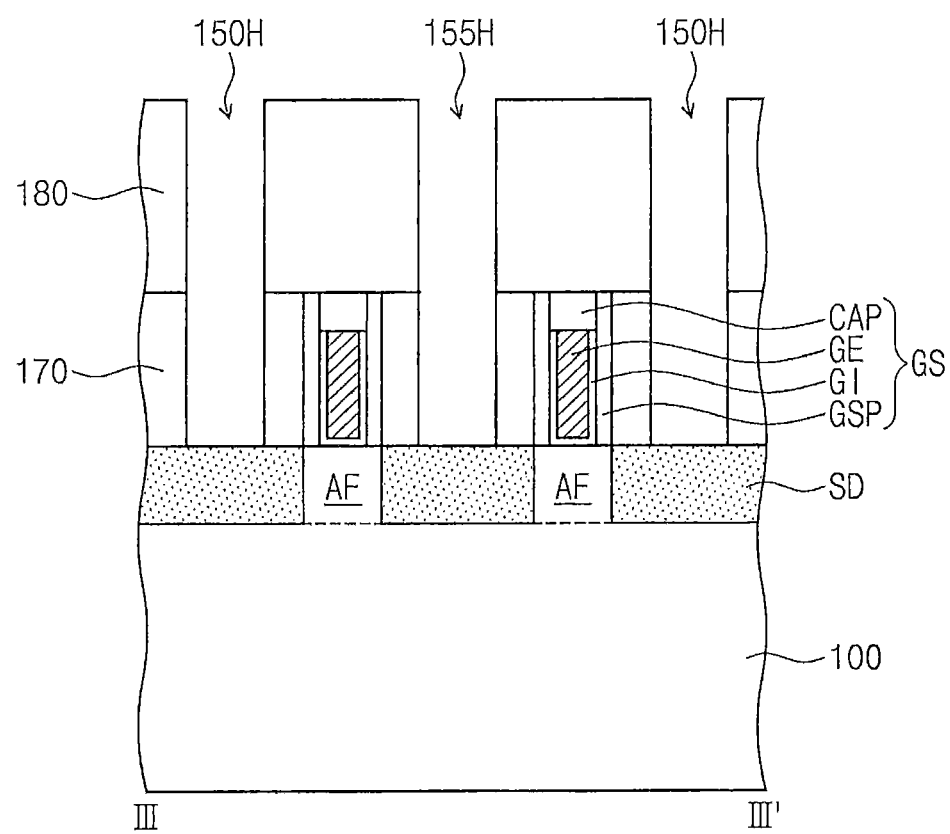
Figure 8D:
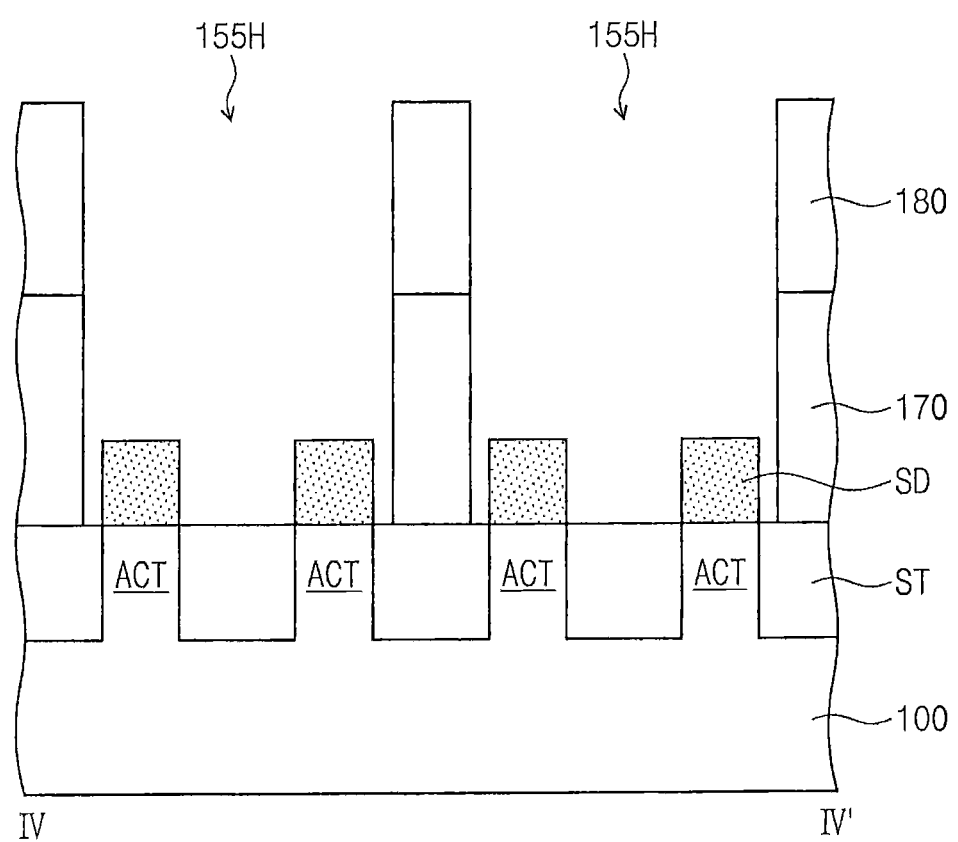
Figure 9A:
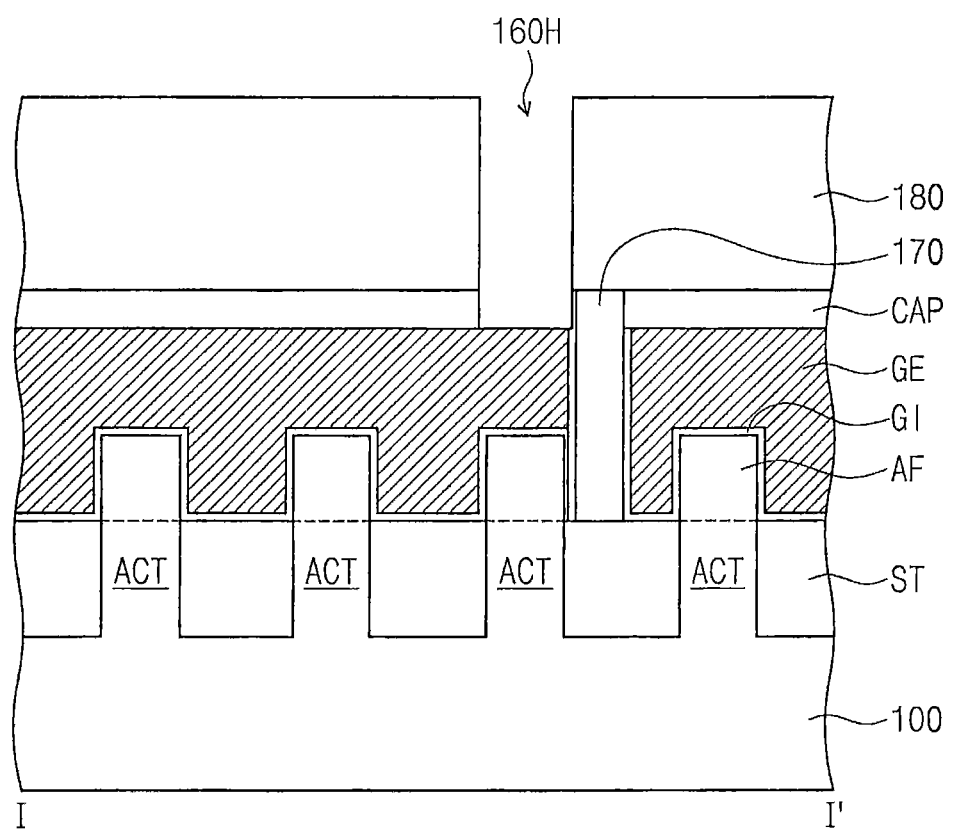
Figure 9B:
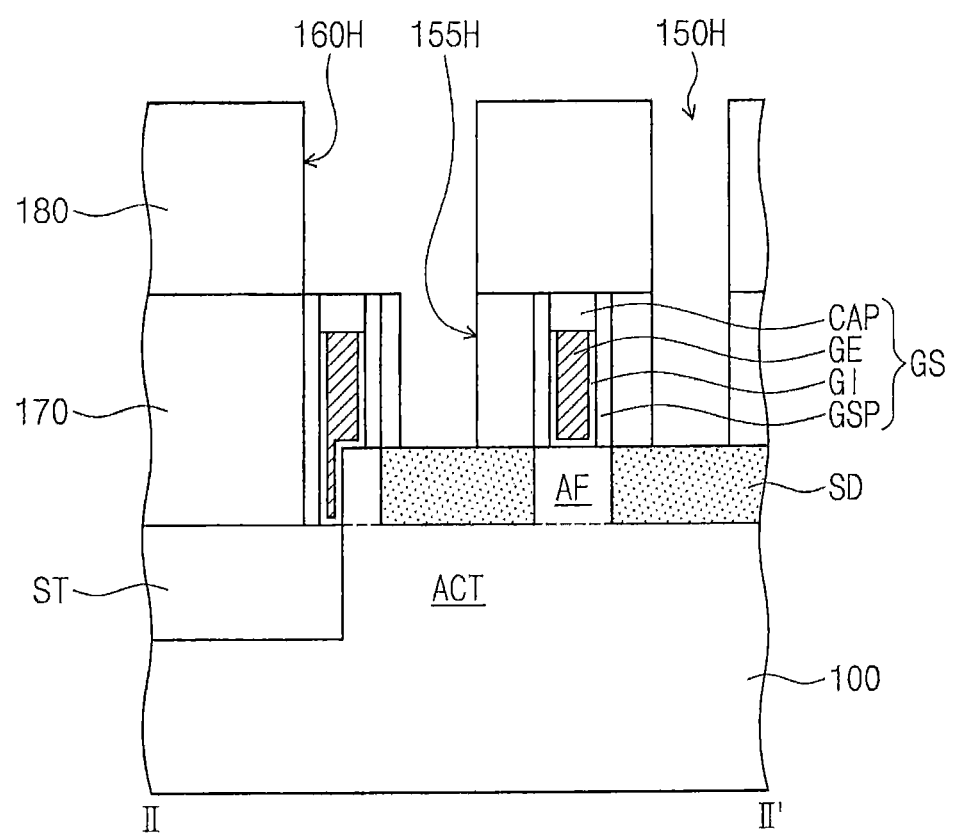
Figure 9C:
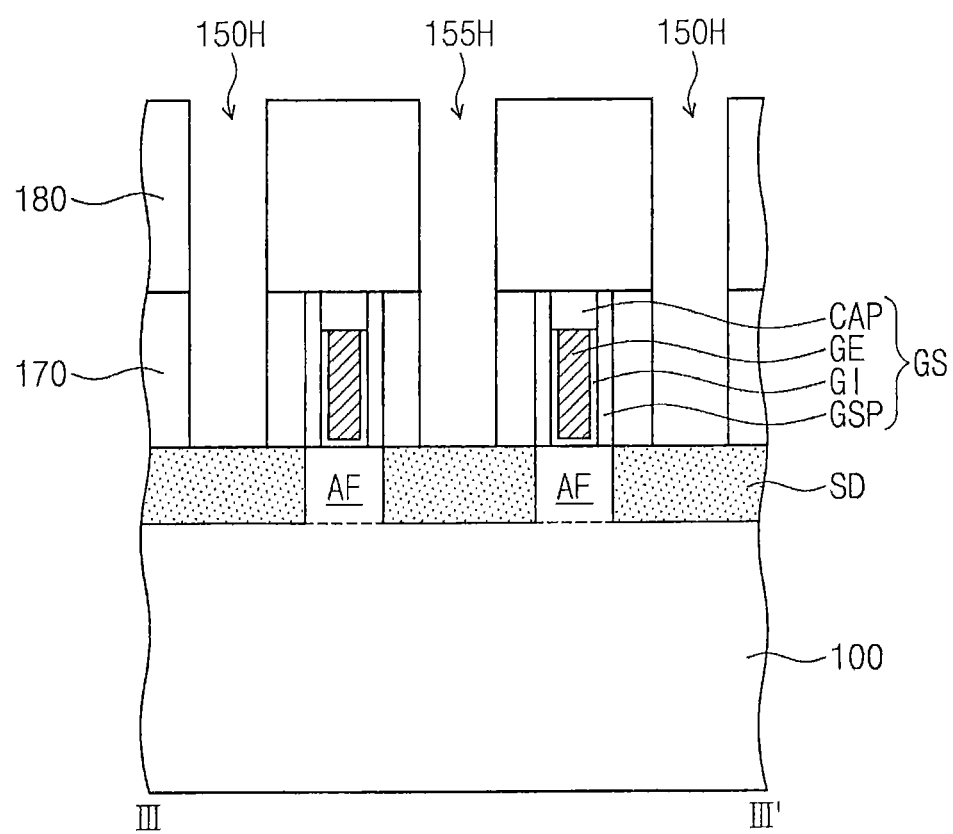
Figure 9D:
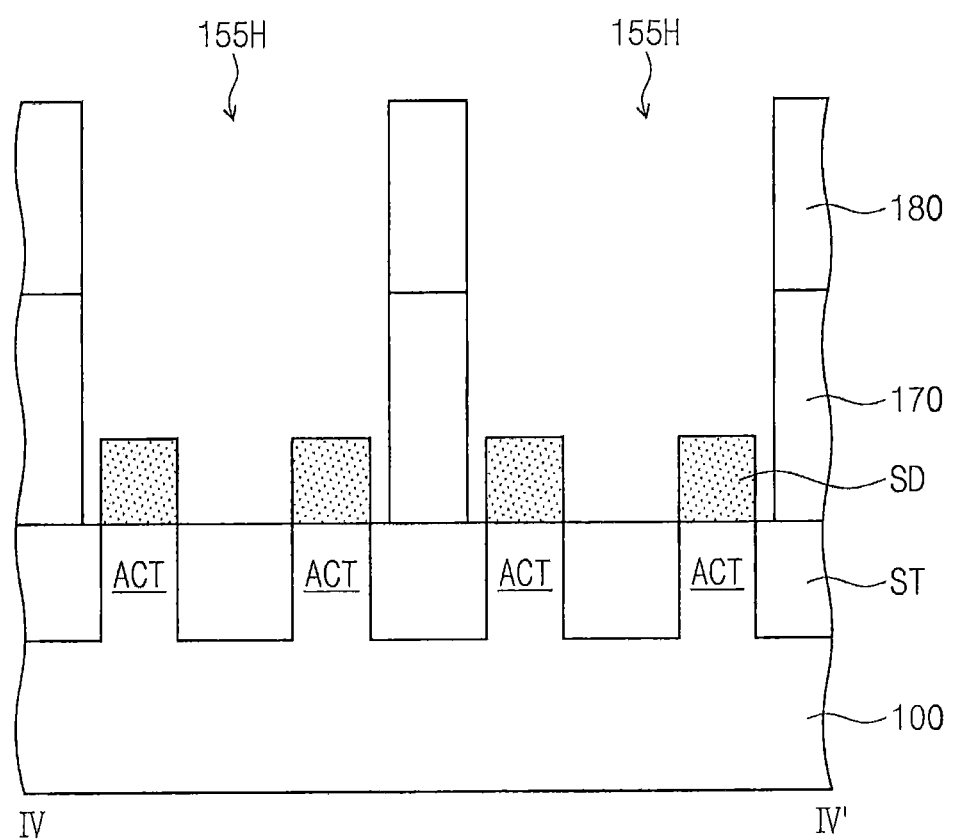

Referring to FIGS. 10, 11, and 4C, the first node contact 155a may include the first end EP1 and the second end EP2 opposite to each other. For example, the first end EP1 may be a portion of the first node contact 155a, which is provided on the first NMOSFET region NR1, and the second end EP2 may be an another portion of the first node contact 155a, which is provided on the PMOSFET region PR. The first end EP1 may be spaced apart at the first distance d1 from each of the first and third gate structures GS1 and GS3. The second end EP2 may laterally shift from the first end EP1 to lie closer to the second gate structure GS2 than to the first gate structure GS1. The second end EP2 may be spaced apart at the second distance d2 from the first gate structure GS1. In some embodiments, the second end EP2 may be in contact with the second gate structure GS2. For example, the second end EP2 may be in contact with the gate spacer GSP provided on a side of the gate electrode GE of the second gate structure GS2. The second end EP2 may be spaced apart from the gate electrode GE of the second gate structure GS2 across the gate spacer GSP (for example, with the gate spacer GSP interleaved therebetween).

The second node contact 155b may have a shape symmetrical to that of the first node contact 155a. The second node contact 155b may include a first end provided on the second NMOSFET region NR2 and a second end provided on the PMOSFET region PR. The first end of the second node contact 155b may be spaced apart at the first distance d1 from each of the second and fourth gate structures GS2 and GS4. The second end of the second node contact 155b may laterally shift from the first end of the second node contact 155b to lie closer to the first gate structure GS1 than to the second gate structure GS2. The second end of the second node contact 155b may be spaced apart at the second distance d2 from the second gate structure GS2. In some embodiments, the second end of the second node contact 155b may be in contact with the first gate structure GS1. For example, the second end of the second node contact 155b may be in contact with the gate spacer GSP provided on a side of the gate electrode GE of the first gate structure GS1. The second end of the second node contact 155b may be spaced apart from the gate electrode GE of the first gate structure GS1 across the gate spacer GSP (for example, with the gate spacer GSP interleaved therebetween).

Figure 12:
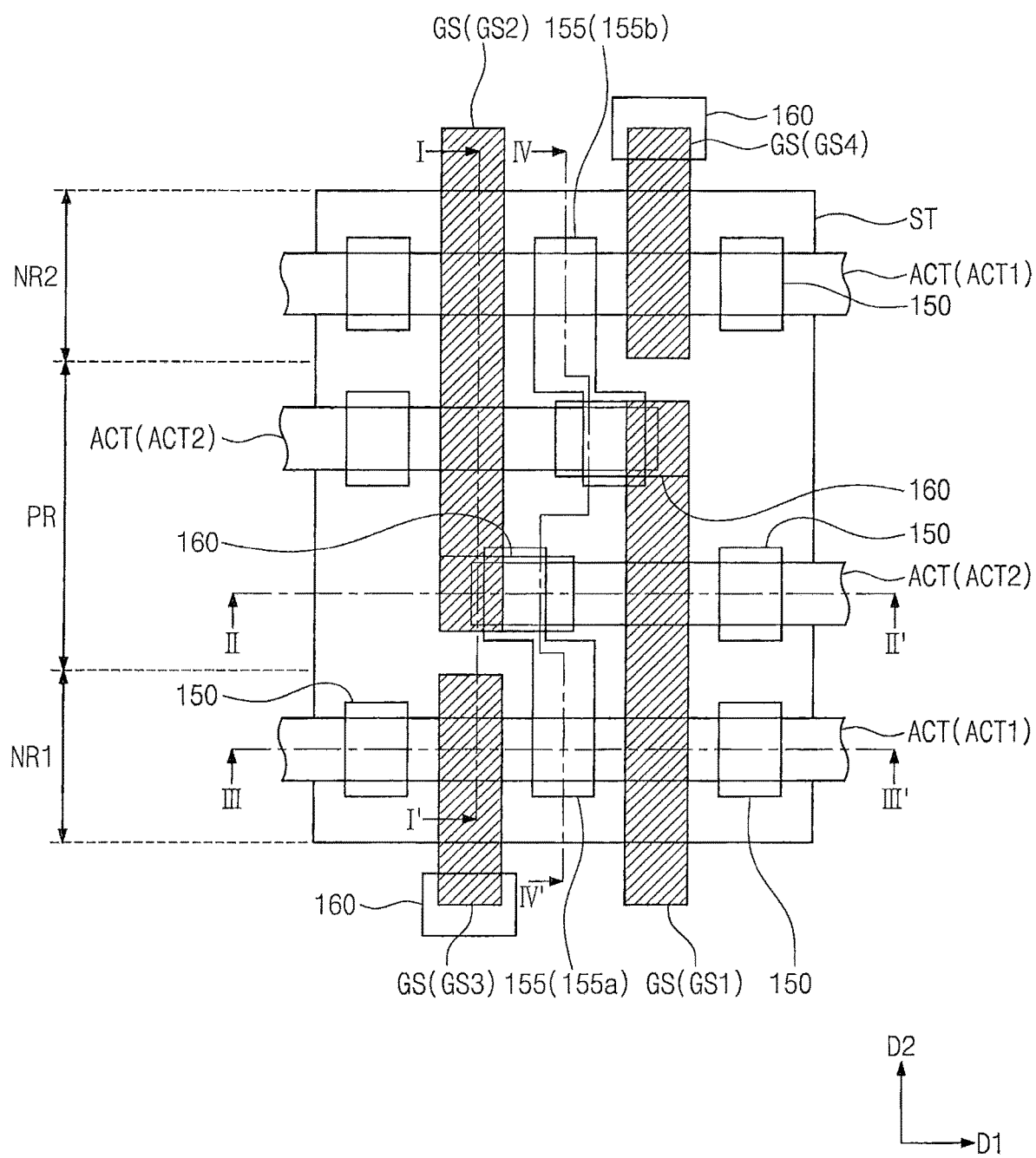
FIG. 12 is a plan view illustrating a semiconductor device according to exemplary embodiments of the present inventive concept.
Figure 13:
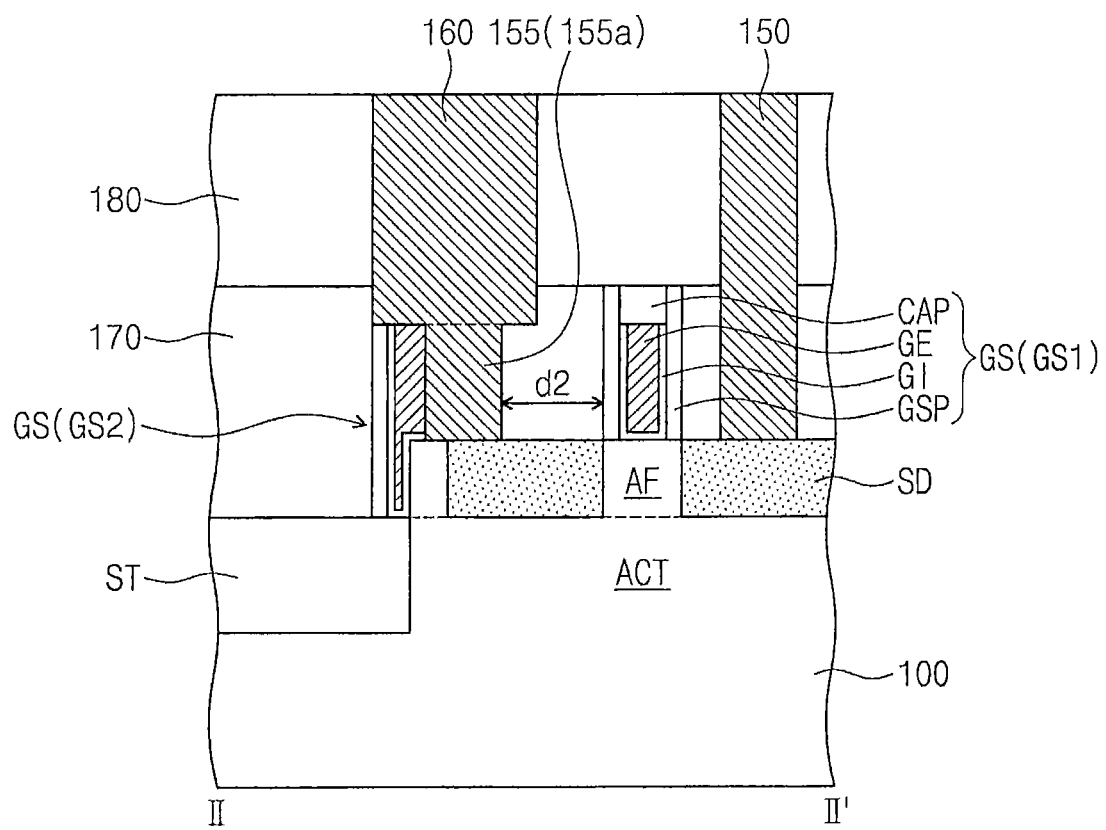
FIG. 13 is a cross-sectional view taken along line II-II' of FIG. 12.

FIG. 12 is a plan view illustrating a semiconductor device according to exemplary embodiments of the present inventive concept. FIG. 13 is a cross-sectional view taken along line II-II' of FIG. 12. Cross-sectional views obtained taken along lines I-I', III-III', and IV-IV' of FIG. 12 are substantially the same as FIGS. 4A, 4C, and 4D, respectively. Those parts of the present exemplary embodiment configurations the same as those of the semiconductor devices according to the foregoing exemplary embodiments described with reference to FIGS. 2, 3, and 4A to 4D are allocated the same reference numerals thereto. In the present exemplary embodiment that follows, differences from the semiconductor devices according to the foregoing exemplary embodiments described with reference to FIGS. 2, 3, and 4A to 4D will be principally explained in the interest of brevity.

Referring to FIGS. 12, 13, and 4C, the first node contact 155a may include the first end EP1 and the second end EP2 opposite to each other. For example, the first end EP1 may be a portion of the first node contact 155a, which is provided on the first NMOSFET region NR1, and the second end EP2 may be an another portion of the first node contact 155a, which is provided on the PMOSFET region PR. The first end EP1 may be spaced apart at the first distance d1 from each of the first and third gate structures GS1 and GS3. The second end EP2 may laterally shift from the first end EP1 to lie closer to the second gate structure GS2 than to the first gate structure GS1. The second end EP2 may be spaced apart at the second distance d2 from the first gate structure GS1. In some embodiments, as viewed in plan, the second end EP2 may partially overlap the second gate structure GS2. The second end EP2 may be in contact with the gate electrode GE of the second gate structure GS2. For example, the gate electrode GE of the second gate structure GS2 may be in contact with the second end EP2 that penetrates the gate spacer GSP provided on a side of the gate electrode GE of the second gate structure GS2.

The second node contact 155b may have a shape symmetrical to that of the first node contact 155a. The second node contact 155b may include a first end provided on the second NMOSFET region NR2 and a second end provided on the PMOSFET region PR. The first end of the second node contact 155b may be spaced apart at the first distance d1 from each of the second and fourth gate structures GS2 and GS4. The second end of the second node contact 155b may laterally shift from the first end of the second node contact 155b to lie closer to the first gate structure GS1 than to the second gate structure GS2. The second end of the second node contact 155b may be spaced apart at the second distance d2 from the second gate structure GS2. In some embodiments, as viewed in plan, the second end of the second node contact 155b may partially overlap the first gate structure GS1. The second end of the second node contact 155b may be in contact with the gate electrode GE of the first gate structure GS1. For example, the second end of the second node contact 155b may penetrate the gate spacer GSP provided on a side of the gate electrode GE of the first gate structure GS1 and be in contact with the gate electrode GE of the first gate structure GS1.

According to the exemplary embodiments described with reference to FIGS. 10 to 13, the second distance d2 may be maximized. Accordingly, an electrical short may be reduced, prevented or minimized between each node contact 155 and its adjacent gate structures GS.

Figure 14:
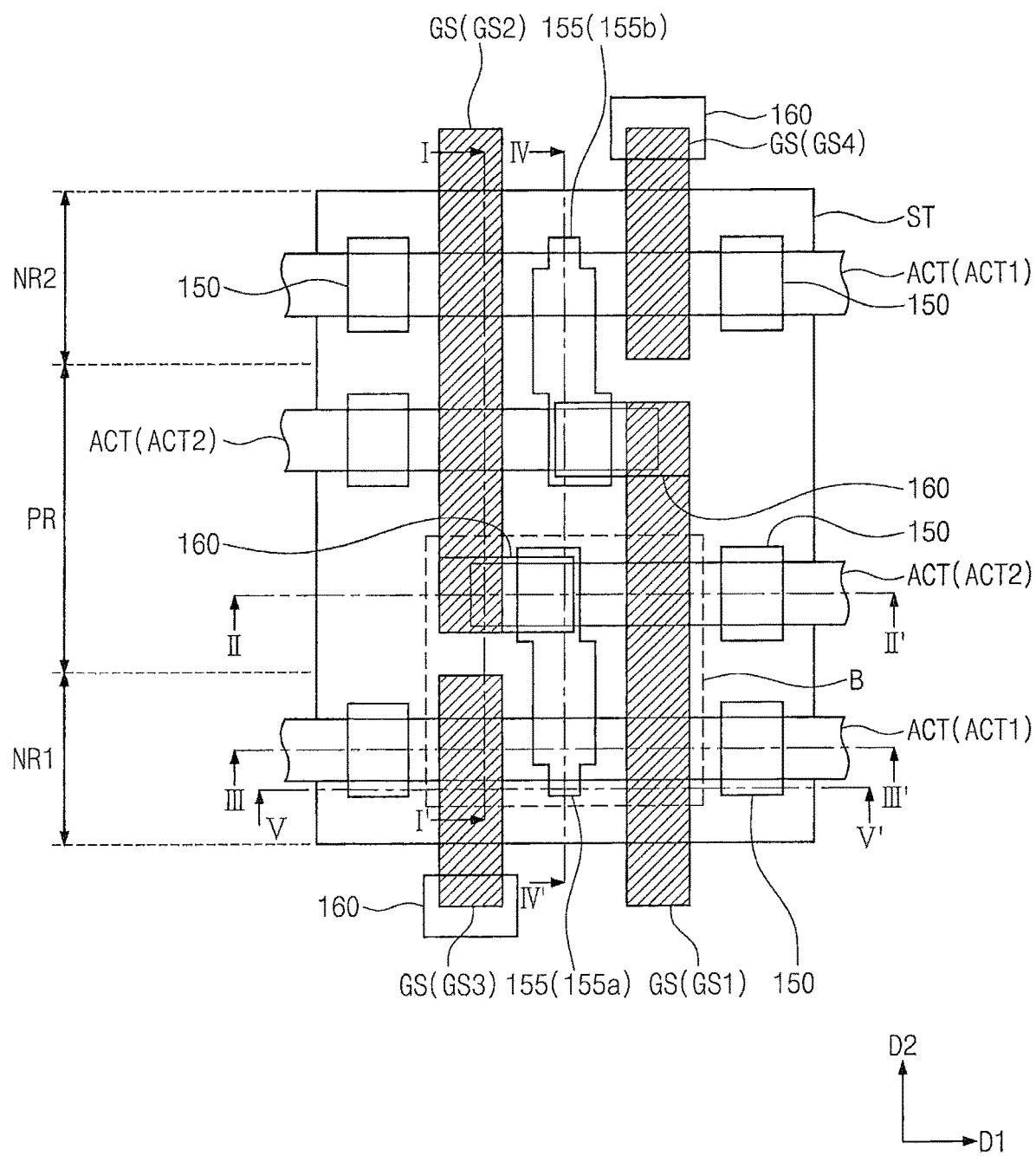
FIG. 14 is a plan view illustrating a semiconductor device according to exemplary embodiments of the present inventive concept.
Figure 15:
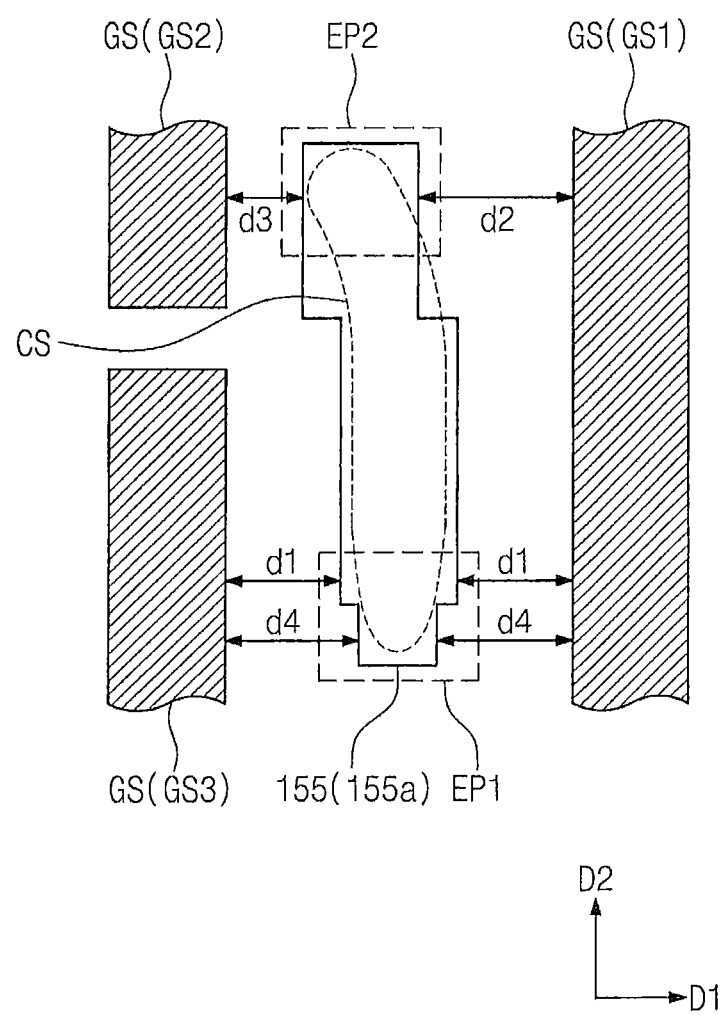
FIG. 15 is an enlarged view corresponding to section B shown in FIG. 14.
Figure 16:
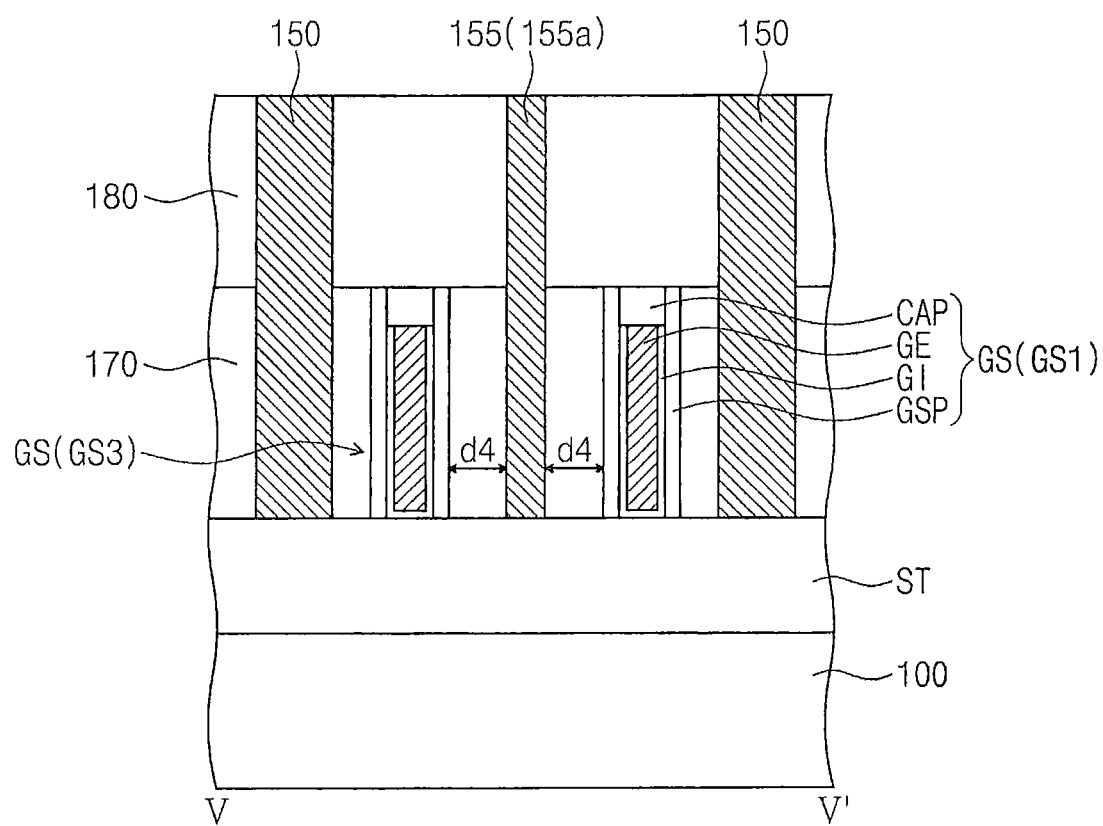
FIG. 16 is a cross-sectional view taken along line V-V' of FIG. 14.

FIG. 14 is a plan view illustrating a semiconductor device according to exemplary embodiments of the present inventive concept. FIG. 15 is an enlarged view corresponding to section B shown in FIG. 14. FIG. 16 is a cross-sectional view taken along line V-V' of FIG. 14. Cross-sectional views obtained taken along lines I-I', II-II', III-III', and IV-IV' of FIG. 14 are substantially the same as FIGS. 4A, 4B, 4C, and 4D, respectively. Those parts of the present exemplary embodiment configurations the same as those of the semiconductor devices according to the foregoing exemplary embodiments described with reference to FIGS. 2, 3, and 4A to 4D are allocated the same reference numerals thereto. In the present exemplary embodiment that follows, differences from the semiconductor devices according to the foregoing exemplary embodiments described with reference to FIGS. 2, 3, and 4A to 4D will be principally explained in the interest of brevity.

Referring to FIGS. 14, 15, 16, 4B, and 4C, the first node contact 155a may include the first end EP1 and the second end EP2 opposite to each other. For example, the first end EP1 may be a portion of the first node contact 155a, which is provided on the first NMOSFET region NR1, and the second end EP2 may be an another portion of the first node contact 155a, which is provided on the PMOSFET region PR. In some embodiments, the first end EP1 may have a width, which is measured along the first direction D1 and decreases with increasing distance from the second end EP2. At least a portion of the first end EP1 may be spaced apart at the first distance d1 from each of the first and third gate structures GS1 and GS3, and at least another portion of the first end EP1 may be spaced apart at a fourth distance d4 from each of the first and third gate structures GS1 and GS3. The fourth distance d4 may be measured along the first direction D1 and may be greater than the first distance d1. The second end EP2 may laterally shift from the first end EP1 to lie closer to the second gate structure GS2 than to the first gate structure GS1. The second end EP2 may be spaced apart at the second distance d2 from the first gate structure GS1. The fourth distance d4 may be less than or equal to the second distance d2. The second end EP2 may be spaced apart from the second gate structure GS2 at the third distance d3, which is less than the first, second, and fourth distances d1, d2, and d4. The first node contact 155a may have, as viewed in plan, a bent line shape extending in the second direction D2. For example, as viewed in plan, the first node contact 155a may have a non-straight line shape CS in which at least a portion of the first node contact 155a is curved to allow the second end EP2 to adjoin the second gate structure GS2. The width of the first end EP1 may continuously or discontinuously decrease with increasing distance from the second end EP2.

The second node contact 155b may have a shape symmetrical to that of the first node contact 155a. The second node contact 155b may include a first end provided on the second NMOSFET region NR2 and a second end provided on the PMOSFET region PR. In some embodiments, the first end of the second node contact 155b may have a width, which is measured along the first direction D1 and decreases with increasing distance from the second end of the second node contact 155b. The second node contact 155b may be configured such that at least a portion of its first end is spaced apart at the first distance d1 from each of the second and fourth gate structures GS2 and GS4 and at least another portion of its first end is spaced apart at the fourth distance d4 from each of the second and fourth gate structures GS2 and GS4. The second end of the second node contact 155b may laterally shift from the first end of the second node contact 155b to lie closer to the first gate structure GS1 than to the second gate structure GS2. The second end of the second node contact 155b may be spaced apart at the second distance d2 from the second gate structure GS2 and at the third distance d3 from the first gate structure GS1. The second node contact 155b may have, as viewed in plan, a bent line shape extending in the second direction D2.

Figure 17:
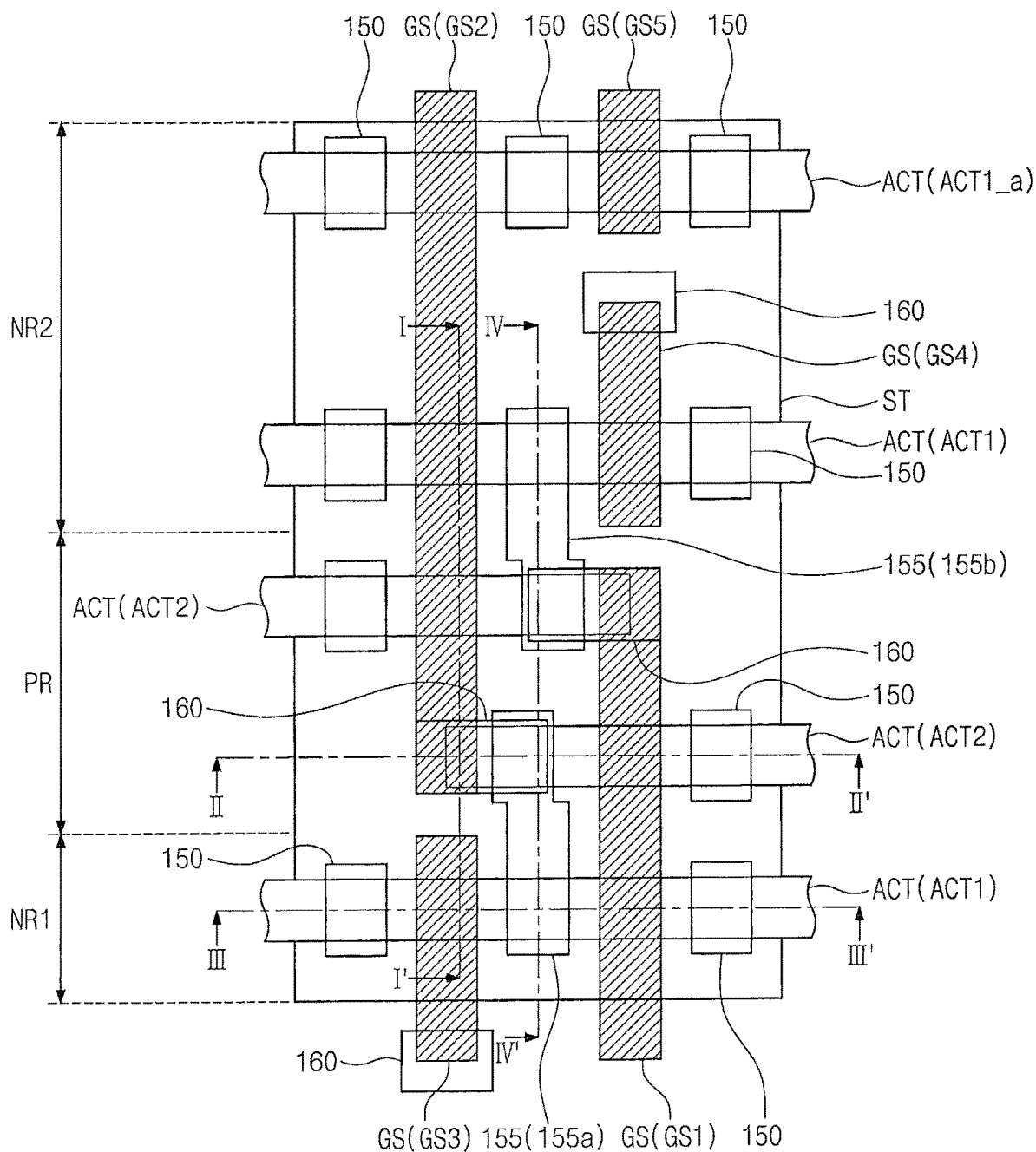
FIG. 17 is a plan view illustrating a semiconductor device according to exemplary embodiments of the present inventive concept.

FIG. 17 is a plan view illustrating a semiconductor device according to exemplary embodiments of the present inventive concept. Cross-sectional views obtained taken along lines I-I', II-II', III-III', and IV-IV' of FIG. 17 are substantially the same as FIGS. 4A, 4B, 4C, and 4D, respectively. Those parts of the present exemplary embodiment configurations the same as those of the semiconductor devices according to the foregoing exemplary embodiments described with reference to FIGS. 2, 3, and 4A to 4D are allocated the same reference numerals thereto. In the present exemplary embodiment that follows, differences from the semiconductor devices according to the foregoing exemplary embodiments described with reference to FIGS. 2, 3, and 4A to 4D will be principally explained in the interest of brevity.

Referring to FIG. 17, the active patterns ACT may include an additional first active pattern ACT1_a provided on the second NMOSFET region NR2. The additional first active pattern ACT1_a may be spaced apart from the PMOSFET region PR across the first active pattern ACT1 on the second NMOSFET region NR2. The second gate structure GS2 may extend in the second direction D2 and run across the additional first active pattern ACT1_a. The gate structures GS may include a fifth gate structure GS5 horizontally spaced apart from the first to fourth gate structures GS1 to GS4. The fifth gate structure GS5 may be provided on the second NMOSFET region NR2 and run across the additional first active pattern ACT1_a. The fifth gate structure GS5 may be aligned in the second direction D2 with the first and fourth gate structures GS1 and GS4, and spaced apart in the first direction D1 from the second gate structure GS2.

The source/drain regions SD may include additional source/drain regions SD provided on the additional first active patterns ACT1_a at opposite sides of each of the second and fifth gate structures GS2 and GS5. The additional first active pattern ACT1_a may include an active fin, which is provided below each of the second and fifth gate structures GS2 and GS5 and interposed between the additional source/drain regions SD. A pair of NMOS transistors may be constituted by the additional first active pattern ACT1_a and the second and fifth gate structures GS2 and GS5 extending across the additional first active pattern ACT1_a. The first and second pull-down transistors, the first and second pull-up transistors, and the first and second access transistors described with reference to FIGS. 2 and 4A to 4D may constitute, together with the pair of NMOS transistors, a dual-port SRAM cell having an isolated read port.

The source/drain contacts 150 may include additional source/drain contacts 150 connected to corresponding additional source/drain regions SD. Although not shown, the gate contacts 160 may include an additional gate contact connected to the fifth gate structure GS5.

According to embodiments of the present inventive concept, a node contact constituting an SRAM cell may be configured to be adjacent to a specific gate structure connected to the node contact and to be spaced apart from other adjacent gate structures at desired distances. As a result, an electrical short may be reduced, prevented or minimized between the node contact and the other adjacent gate structures. Embodiments of the present inventive concept may, therefore, provide a semiconductor device that is suitable for high integration and has improved electrical characteristics.

The aforementioned description provides exemplary embodiments for explaining the present inventive concept.

Therefore, the present inventive concept is not limited to the embodiments described above, and it will be understood by one of ordinary skill in the art that variations in form and detail may be made therein without departing from the spirit and essential features of the inventive concept.

What is claimed is:

1. A semiconductor device, comprising:
a first active pattern and a second active pattern that extend in a first direction on a substrate and are spaced apart from each other in a second direction crossing the first direction, each of the first active pattern and the second active pattern having an active fin protruding upwardly;
a first gate structure that extends across the first active pattern and the second active pattern and covers top and side surfaces of the active fin of each of the first active pattern and the second active pattern;
a second gate structure that is spaced apart from the first gate structure; and
a node contact between the first gate structure and the second gate structure, the node contact not having any overlap with the first gate structure and the second gate structure in a plan view of the semiconductor device,
wherein the node contact comprises a first end adjacent to the first active pattern and a second end adjacent to the second active pattern,
the first end of the node contact being connected to a source/drain region on the first active pattern, the second end of the node contact being connected to a gate electrode of the second gate structure,
the second end of the node contact being shifted in the first direction relative to the first end of the node contact so as to be closer to the second gate structure than to the first gate structure.

2. The semiconductor device of claim 1, wherein the first end of the node contact is spaced apart from the first gate structure at a first distance,
the second end of the node contact being spaced apart from the first gate structure at a second distance greater than the first distance.

3. The semiconductor device of claim 2, wherein the second end of the node contact is spaced apart from the second gate structure at a third distance less than the first and second distances.

4. The semiconductor device of claim 2, further comprising a third gate structure that is spaced apart from the first gate structure across the node contact and extends across the first active pattern,
wherein the second gate structure and the third gate structure are arranged to be spaced apart from each other in the second direction,
wherein the second end of the node contact is spaced apart from the second gate structure at a third distance, and
the first end of the node contact is spaced apart from the third gate structure at a fourth distance different from the third distance.

5. The semiconductor device of claim 4, wherein the third distance is less than the fourth distance.

6. The semiconductor device of claim 1, wherein the second end of the node contact includes a portion of the node contact, which is connected to a source/drain region on the second active pattern, and a gate contact connected to a top surface of the gate electrode of the second gate structure.

7. The semiconductor device of claim 6, wherein the gate electrode of the second gate structure is electrically connected to the source/drain regions of the first and second active patterns through the node contact.

8. The semiconductor device of claim 6, wherein the gate contact comprises a same material as that of the node contact.

9. The semiconductor device of claim 6, wherein the gate contact has a top surface at a same height as that of a top surface of the node contact relative to the substrate.

10. The semiconductor device of claim 1, wherein the first active pattern and the second active pattern have different conductivity types from each other.

11. A semiconductor device, comprising:
a first active pattern and a second active pattern that extend in a first direction on a substrate and are spaced apart from each other in a second direction crossing the first direction, each of the first active pattern and the second active pattern having an active fin protruding upwardly;
a first gate structure and a second gate structure that extend in the second direction on the substrate and are immediately next to each other in the first direction, the first gate structure crossing the first and second active patterns and covering top and side surfaces of the active fin of each of the first and second active patterns; and
a node contact between the first gate structure and the second gate structure,
wherein the node contact comprises a first end being connected to a top surface of a first source/drain region on the first active pattern, and a second end being connected to a second source/drain region on the second active pattern and a top surface of a gate electrode of the second gate structure, the second end of the node contact being shifted relative to the first end of the node contact so as to be closer to the second gate structure than to the first gate structure,
wherein the second gate structure comprises the gate electrode on the substrate and a gate spacer on a sidewall of the gate electrode, and
wherein the gate spacer is between the second end of the node contact and the gate electrode.

12. The semiconductor device of claim 11, wherein the node contact has a bent line shape, at least a portion of the node contact extending in the second direction in a plan view of the semiconductor device.

13. The semiconductor device of claim 11, further comprising a third gate structure that is spaced apart from the first gate structure across the node contact and extends across the first active pattern,
wherein the second gate structure and the third gate structure are arranged to be spaced apart from each other in the second direction,
wherein a pitch between the first and second gate structures is the same as a pitch between the first and third gate structures.

14. The semiconductor device of claim 13, wherein the first end of the node contact is spaced apart from the first gate structure at a first distance, the second end of the node contact is spaced apart from the first gate structure at a second distance, and the second end of the node contact is spaced apart from the second gate structure at a third distance, and
wherein the first distance, the second distance, and the third distance are different from each other.

15. The semiconductor device of claim 14, wherein the third distance is less than the first distance and the second distance.

16. The semiconductor device of claim 15, wherein the second distance is greater than the first distance.

17. The semiconductor device of claim 11, wherein the second end of the node contact includes a portion of the node contact, which is connected to a top surface of the second source/drain region on the second active pattern, and a gate contact connected to the top surface of the gate electrode of the second gate structure.

18. The semiconductor device of claim 17, wherein the gate contact comprises a same material as that of the node contact.

19. The semiconductor device of claim 17, wherein the gate contact has a top surface at a same height as that of a top surface of the node contact relative to the substrate.

* * * * *